US007923488B2

(12) United States Patent
Xu et al.

(10) Patent No.: US 7,923,488 B2
(45) Date of Patent: Apr. 12, 2011

(54) EPOXY COMPOSITIONS

(75) Inventors: Qianfei Xu, Mountain View, CA (US); Chung-Jen Hou, Pensacola, FL (US); Rong-Chang Liang, Cupertino, CA (US)

(73) Assignee: Trillion Science, Inc., Fremont, CA (US)

(*) Notice: Subject to any disclaimer, the term of this patent is extended or adjusted under 35 U.S.C. 154(b) by 1068 days.

(21) Appl. No.: 11/581,302

(22) Filed: Oct. 16, 2006

(65) Prior Publication Data

US 2008/0090943 A1 Apr. 17, 2008

(51) Int. Cl.
*C08L 63/00* (2006.01)
*B32B 27/38* (2006.01)

(52) U.S. Cl. ........................................ 523/461; 428/413

(58) Field of Classification Search .......................... None
See application file for complete search history.

(56) References Cited

U.S. PATENT DOCUMENTS

| | | | |
|---|---|---|---|
| 4,247,234 A | 1/1981 | Hoffman | |
| 4,606,962 A | 8/1986 | Reylek | |
| 4,696,764 A | 9/1987 | Yamazaki | |
| 4,740,657 A | 4/1988 | Tsukagoshi et al. | |
| 4,877,761 A | 10/1989 | Chmiel et al. | |
| 5,087,494 A | 2/1992 | Calhoun et al. | |
| 5,136,359 A | 8/1992 | Takayama et al. | |
| 5,141,790 A | 8/1992 | Calhoun et al. | |
| 5,162,087 A | 11/1992 | Fukuzawa | |
| 5,163,837 A | 11/1992 | Rowlette, Sr. | |
| 5,216,065 A | 6/1993 | Colyer et al. | |
| 5,219,462 A | 6/1993 | Bruxvoort et al. | |
| 5,275,856 A | 1/1994 | Calhoun et al. | |
| 5,300,340 A | 4/1994 | Calhoun et al. | |
| 5,366,140 A | 11/1994 | Koskenmaki et al. | |
| 5,437,754 A | 8/1995 | Calhoun et al. | |
| 5,438,223 A | 8/1995 | Higashi et al. | |
| 5,486,427 A | 1/1996 | Koskenmaki et al. | |
| 5,522,962 A | 6/1996 | Koskenmaki et al. | |
| 5,533,447 A | 7/1996 | Johnson et al. | |
| 5,589,523 A * | 12/1996 | Sawaoka et al. .............. 523/211 |
| 5,613,862 A | 3/1997 | Naylor | |
| 5,672,400 A | 9/1997 | Hansen et al. | |
| 5,769,996 A | 6/1998 | Mcardle et al. | |
| 5,820,450 A | 10/1998 | Calhoun et al. | |
| 5,839,188 A | 11/1998 | Pommer | |
| 5,851,644 A | 12/1998 | Mcardle | |
| 5,882,802 A | 3/1999 | Ostoiski | |
| 5,916,641 A | 6/1999 | Mcardle et al. | |
| 6,011,307 A | 1/2000 | Jiang et al. | |
| 6,042,894 A | 3/2000 | Goto et al. | |
| 6,120,489 A | 9/2000 | Johnson et al. | |
| 6,180,226 B1 | 1/2001 | Mcardle et al. | |
| 6,214,460 B1 | 4/2001 | Bluem et al. | |
| 6,274,508 B1 | 8/2001 | Jacobson et al. | |
| 6,281,038 B1 | 8/2001 | Jacobson et al. | |
| 6,352,775 B1 | 3/2002 | Sasaki et al. | |
| 6,402,876 B1 | 6/2002 | Mcardle et al. | |
| 6,423,172 B1 | 7/2002 | Mcardle et al. | |
| 6,555,408 B1 | 4/2003 | Jacobson et al. | |
| 6,566,744 B2 | 5/2003 | Gengel | |
| 6,632,532 B1 | 10/2003 | Yamada et al. | |
| 6,672,921 B1 | 1/2004 | Liang et al. | |
| 6,683,663 B1 | 1/2004 | Hadley et al. | |
| 6,751,008 B2 | 6/2004 | Liang et al. | |
| 6,770,369 B1 | 8/2004 | Oyamada et al. | |
| 6,784,953 B2 | 8/2004 | Liang et al. | |
| 6,788,452 B2 | 9/2004 | Liang et al. | |
| 6,833,943 B2 | 12/2004 | Liang et al. | |
| 6,834,612 B2 | 12/2004 | Chambers et al. | |
| 6,884,833 B2 | 4/2005 | Chheang et al. | |
| 6,906,427 B2 | 6/2005 | Tanaka et al. | |
| 2001/0008169 A1 | 7/2001 | Connell et al. | |
| 2002/0140093 A1 * | 10/2002 | Yamazaki et al. ............ 257/734 |
| 2006/0054867 A1 | 3/2006 | Yamada | |
| 2007/0191520 A1 * | 8/2007 | Sugiki et al. .................. 524/160 |
| 2008/0191174 A1 | 8/2008 | Ehrensvard et al. | |

FOREIGN PATENT DOCUMENTS

| | | |
|---|---|---|
| EP | 1168373 B1 | 1/2006 |
| JP | 61074205 A * | 4/1986 |
| JP | 07173667 A * | 7/1995 |
| JP | 2005-226014 A * | 8/2005 |
| WO | WO 00/00563 | 1/2000 |
| WO | WO 2005/100472 A1 * | 10/2005 |
| WO | WO 2007130127 A2 * | 11/2007 |
| WO | WO 2007130137 A2 * | 11/2007 |

OTHER PUBLICATIONS

Machine translation of JP 2005-226014 A, provided by the JPO website (no date).*
Asai, et al., Development of an Anistropic Conductive Adhesive Film (ACF) from Epoxy Resins, Journal of Applied Polymer Science, pp. 769-777, John Wiley and Sons, Inc. (No Date).
Dokoutchaev, A., et al., "Colloidal Metal Deposition onto Functionalized Plystyrene Microspheres," Chem Matter, 1999, 11, pp. 2389-2399, American Chemical Society.
Gengel, "A Process for the Manufacture of Cost Competitive MCM Substrates," MCM '94, 1992,pp. 182-187.
Ishibashi, et al., "A New Anisotropic Conductive Particles" IEEE Transactions on Components, Packaging, and Manufacturing Technology—Part B, vol. 19, No. 4 Nov. 1996, pp. 752-757.

(Continued)

*Primary Examiner* — Michael J Feely
(74) *Attorney, Agent, or Firm* — Thompson Hine LLP

(57) ABSTRACT

An epoxy composition for applications such as one-part adhesives, coatings, prepreg and molding compounds that includes leuco dyes, particularly those comprising a N,N-dialkylamino-, N,N-diarylamino-, N-alkyl-N-arylamino-, N-alkylamino- or N-arylamino- functional group on one of the aromatic rings, as a co- catalyst or co-curing agent. The use of the leuco dye co-catalyst provides improved curing speed of the epoxy composition comprising a latent curing agent/catalyst such as imidazole microcapsules while maintaining the shelf-life stability. The epoxy may also include a secondary co-catalyst that includes a urea, particularly those comprising a N,N-dialkylamino-, N,N-diarylamino-, N-alkyl-N-arylamino- or dicycloalkylamino- functional group. Secondary cocatalysts of low mobility at the storage conditions are particularly preferred. The improved epoxy composition is implemented as adhesives for manufacturing an anisotropic conductive film (ACF) and also for connecting, encapsulating, or packaging of electronic devices.

2 Claims, 5 Drawing Sheets

OTHER PUBLICATIONS

Mescher, et al., "Application Specific Flip Chip Packages; Consideration and Options in Using FCIP," Pan Pacific Microelectronics Syposium Conference, Jan. 2000.

Search Report for PCT/US2006/042229 (published as WO 2007/130127 A3) (2008).

Ugelstad, et al., "Biomedical Applications of Monodisperse Magnetic Polymer Particles," Future Directions in Polymer Colloids (1987), p. 355, El-sser and Fitch (ed.) Martinus Nijhoff (pub).

Ugelstad, et al., "Preparation and Application of Monodisperse Polymer Particles," Journal of Polymer Science 72, (1985), pp. 225-240.

Ugelstad, et al., Swelling of Olgiomer-Polymer Particles, New Methods of Preparation of Emulsion and Polymer Disperson; Advances in Colloid and Interface Science, 13, (1980), pp. 101-140, Elsevier Scientific Publishing Company, Amsterdam.

Yamaguchi, et al., "Cupil-T Anisotropic Conductive Film for Testing," Nitto Giho, vol. 40, Sep. 2002, pp. 17-20.

Search Report for PCT/US2006/046807 (published as WO 2007/130137 A3) (2009).

\* cited by examiner

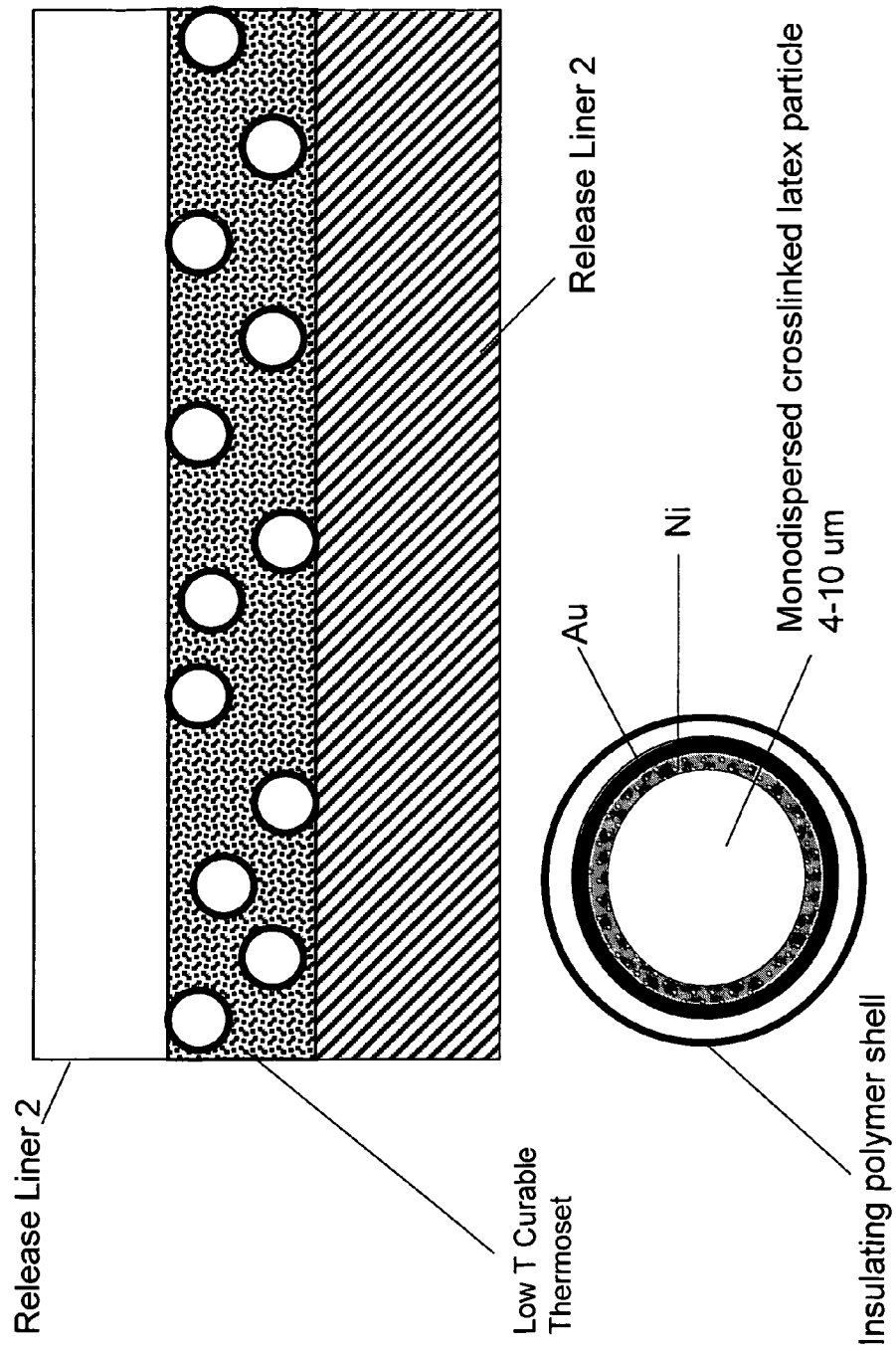

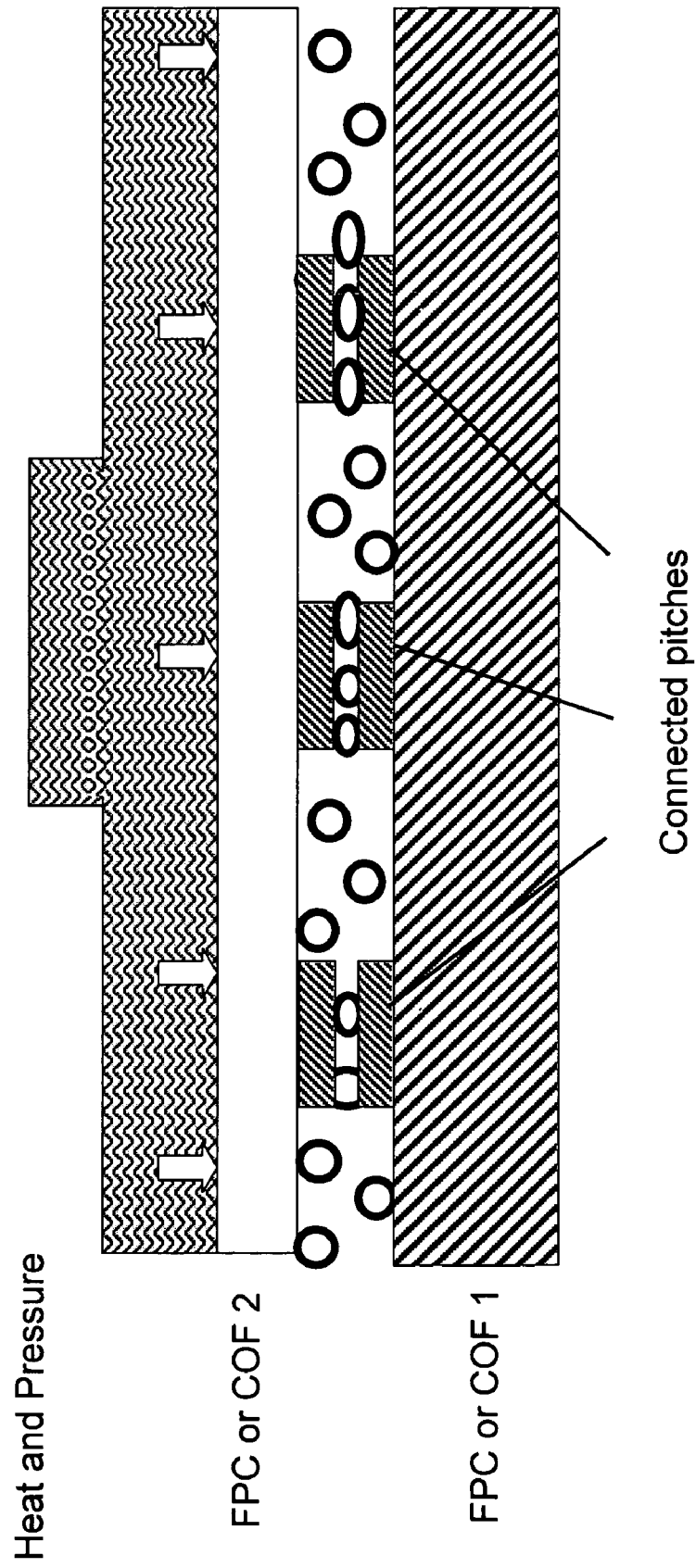
Figure 1B Anisotropic Conductive Film (ACF)

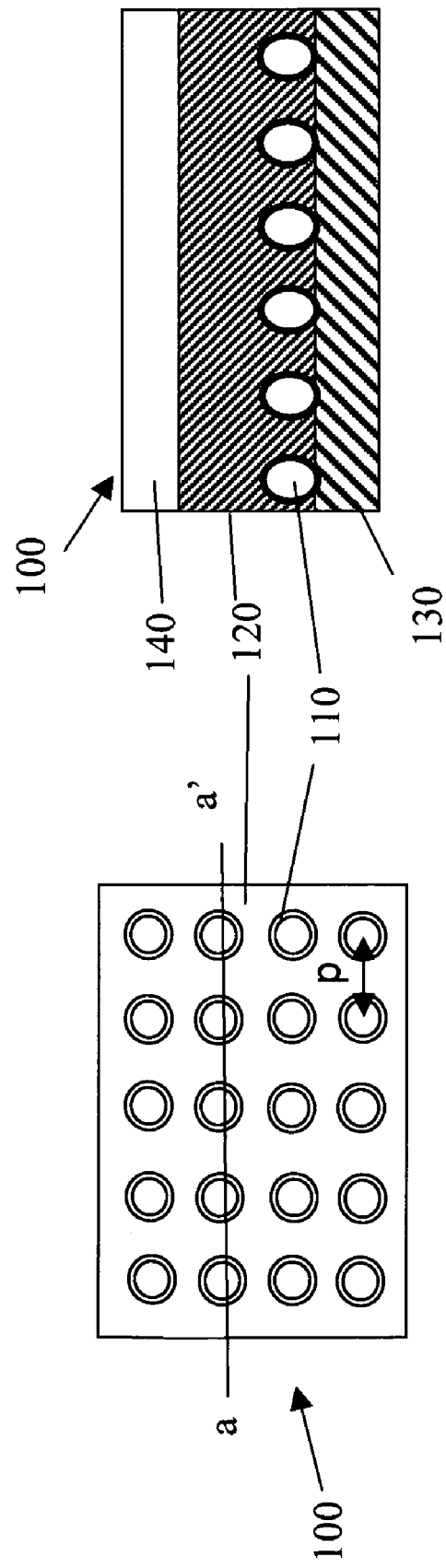

EPOXY COMPOSITIONS

BACKGROUND OF THE INVENTION

1. Field of the Invention

The invention relates to epoxy adhesive or molding compound compositions suitable for connecting, assembling, encapsulating or packaging electronic devices particularly for display, circuit board, flip chip and other semiconductor devices. This invention particularly relates to one-part epoxy compositions that are of long shelf life at storage conditions but are highly reactive at the curing or molding temperature. More specifically, application of this epoxy relates to adhesives for an anisotropic conductive film (ACF) to adhesively bond two electric terminals to achieve good electroconductivity between the two terminals in the vertical Z-direction perpendicular to the adhesive film, while remain highly insulating within the horizontal X-Y plane of the film.

2. Description of the Related Art

Even though the one-part epoxy systems have the advantages of convenient applications as adhesive or molding compounds for connecting, assembling, encapsulating or packaging electronic devices, however, they still suffer severe drawbacks of low shelf-life stability and a requirement of storing at a low temperature. For adhesive or molding compound applications, the thermoset adhesives, particularly the epoxies, are considered as superior to the thermoplastic adhesives because of the process-ability of the uncured composition and the heat resistance of the cured products. Furthermore, among the epoxy applications, the one-part epoxy systems are in general more preferred than the two-part systems for most of the molding compounds and pre-coated products including anisotropic conductive adhesive films (ACFs or ACAFs). This is because the one-part systems are much more user friendly between these two systems.

Specifically, the one-part epoxy system typically includes an uncured epoxy resin component, a curing agent and/or an accelerator. The resin component includes at least one epoxy resin, which has two or more epoxy groups in a single molecule. The curing agent such as the catalyst or accelerator initiates and/or accelerates the reaction by either catalyzing and/or taking part in the reaction. Preferably, the accelerator component and the other epoxy adhesive components are selected such that the epoxy adhesive is very stable at the storage conditions but cures rapidly at the bonding temperature. Reviews of the epoxy crosslinking system may be found in, for examples, J. K. Fink, Reactive Polymers, Fundamentals and Applications_, William Andrew Publishing, NY (2005); J. A. Brydson, Plastic Materials, Ch. 26, 7$^{th}$ ed., Butterworth-Heinemann (1999); C. D. Wright and J. M. Muggee in S. R. Hartshorn, ed., Structure Adhesives, Ch. 3, Plenum Press, NY (1986); and H. Lee, The Epoxy Resin Handbook, McGraw-Hill, Inc., NY (1981). However, as disclosed in these publications, the one-part systems still suffer severe drawbacks due to the lack of shelf-life stability and the low temperature storage requirements.

The problem of shelf-life stability is even worse in applications that require high speed curing at low temperature. To address this issue, curing catalysts/accelerators are absorbed in a molecular sieve or in the form of microcapsules to enhance the curing processes as disclosed in Japanese Patent Publication No. 17654/68, 64/70523, U.S. Pat. Nos. 4,833, 226, 5,001,542, 6,936,644. In the case of microencapsulated accelerators or curing agents, the microcapsules must be first broken or rendered permeable by pressure, shear, heat or combinations of above methods in order to cure the epoxy resin. Examples of commercially available imidazole microcapsules include the Novacure series from Asahi Chemical Industry Co., Ltd. However, in most cases, the stability is improved at the expense of curing speed.

The selection of the curing agents of the one-part epoxy system to assure shelf-life stability is very important for applying the one-part epoxy system as adhesive for making the ACF film. It has been found that the instability of ACF connection resistance may be attributed to the premature reaction between the adhesive and the curing agent that takes place during storage. Such premature reaction between the adhesive and the curing agent during storage causes a decrease of fluidity of the adhesives. The decrease in the adhesive fluidity further results in either (1) insufficiently removal of the adhesive, or the protective insulating shell, if present, from the surface of electroconductive particle or, (2) too high a viscosity of the adhesive before the conductive particles may come into a sufficient contact with circuit. It has also been found that such an insufficient contact is particularly remarkable when the electroconductive particle is a pressure-deformable particle. To suppress the undesirable reactions before bonding and improve the reliability of device connection of the high speed or low temperature curing ACFs, there is an urgent need for a more stable curing system while maintaining and even more preferably increasing the curing rate. However, until now, a curing agent/accelerator capsule with a thicker or less permeable wall when employed to improve the stability often achieve the stability improvement at the expense of the curing speed at the bonding conditions.

The use of leuco dyes in a variety of applications including carbonless paper, thermal recording paper and photoimaging systems has been reviewed extensively in for examples, R. Muthyala, ed., Chemistry and Applications of Leuco Dyes, Ch. 1, 4, 5 and 6 Plenum Press, NY (1997) and P. Gregory, High Technology Applications of Organic Colorants, Ch. 8, Plenum Press, NY (1991). In a conventional process for fabricating the anisotropic conductive film (ACF), the use of an irreversibly thermochromic pigment in the adhesive has been taught as a temperature indicator to show that the highest temperature has reached by a color change of the temperature indicator. However, such applications of various kinds of leuco dyes or pigments, particularly those disclosed in the present invention, do not address the technical difficulties of the shelf-life stability and the curing speed of the epoxy compositions particularly in applications such as connecting, assembling, encapsulating or packaging electronic devices.

Therefore, a need exists in the art to provide improved one-part epoxy adhesives, coatings or molding compounds particularly for manufacturing electronic devices with improved shelf-life stability and in the meantime provide high speed or low temperature curing process such that the above discussed difficulties and limitations can be resolved.

SUMMARY OF THE PRESENT INVENTION

Therefore, the first aspect of the present invention is directed to the use of leuco dyes, particularly those comprising a N,N-diarylamino, N-alkyl-N-aryl-amino, N-alkylamino, or N-arylamino functional group functional group on at least one of the aromatic rings, as a co-catalyst or co-curing agent in an epoxy composition for applications such as one-part epoxy adhesives, coatings, prepregs and molding compounds.

The second aspect of the present invention is directed to the use of the leuco dye co-catalyst to improve the curing of the epoxy composition comprising a latent curing agent/catalyst such as Novacure imidazole microcapsules while maintaining the shelf-life stability.

The third aspect of the present invention is directed to an epoxy composition comprising a latent curing agent/catalyst, a leuco dye co-catalyst and a secondary co-catalyst including amides and lactams, particularly those comprising a N,N-dialkylamino, N,N-diarylamino, N-alkyl-N-aryl-amino or dicycloalkylamino functional group. Secondary co-catalysts of low mobility at the storage conditions, such as those with a long chain substitutent, dimeric or oligomeric amides or lactams, are particularly preferred.

The fourth aspect of the present invention is directed to a conductive coating or adhesive, particularly ACF, comprising the epoxy composition of the present invention.

The fifth aspect of the present invention is directed to a non-random array ACF comprising the epoxy composition of the present invention.

The sixth aspect of the present invention is directed to an electronic device connected, encapsulated, or packaged with the epoxy composition of the present invention.

The seventh aspect of the present invention is directed to a composite structure fabricated or molded with a molding compound or prepreg that includes the epoxy composition of the present invention.

The eighth aspect of the present invention is directed to an one-part epoxy composition comprising a leuco dye co-catalyst of the present invention and a thermally conductive but electrically insulating particulate to improve the thermomechanical properties and heat management of the composition and the devices connected therewith.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 1A to 1D are the schematic drawing of cross sectional views of a typical ACF product and their uses in electrode connection or chip bonding.

FIGS. 2A and 2B are the schematic drawings of the top view and cross section view of a non-random array ACF.

DETAILED DESCRIPTION OF THE PREFERRED EMBODIMENT

This invention discloses a new, non-obvious and unexpected application of the leuco dyes, particularly those comprising a N,N-dialkylamino, N,N-diarylamino, N-alkyl-N-aryl-amino, N-alkylamino, or N-arylamino functional group on at least one of their aromatic rings, to function as a very effective co-catalysts or co-accelerators to significantly improve the curing characteristics of epoxy resins without trade-off in the shelf-life stability of the one-part epoxy system. More specifically, this invention discloses improved adhesive compositions comprising a leuco dye and a latent curing agent such as Novacure imidazole capsules. The leuco dyes as disclosed in this invention have shown very significant improvement in curing and conversion of the epoxides while maintaining acceptable shelf-life stability. The concentration of the leuco dye used is from about 0.05% by weight to about 15% by weight, preferably from about 0.5% by weight to about 5% by weight based on the total weight of the adhesive composition.

Figure 1C:
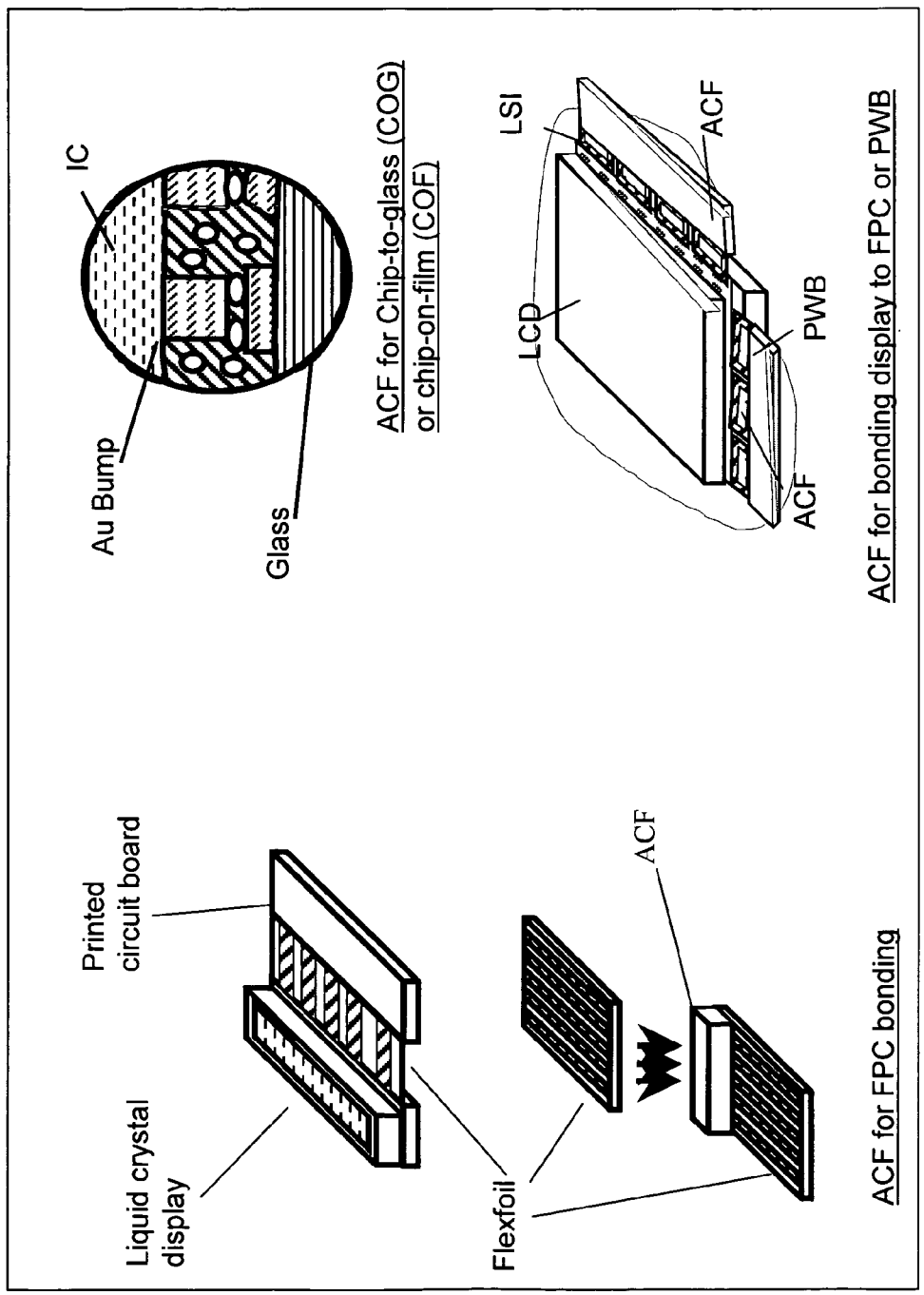
Figure 1D:
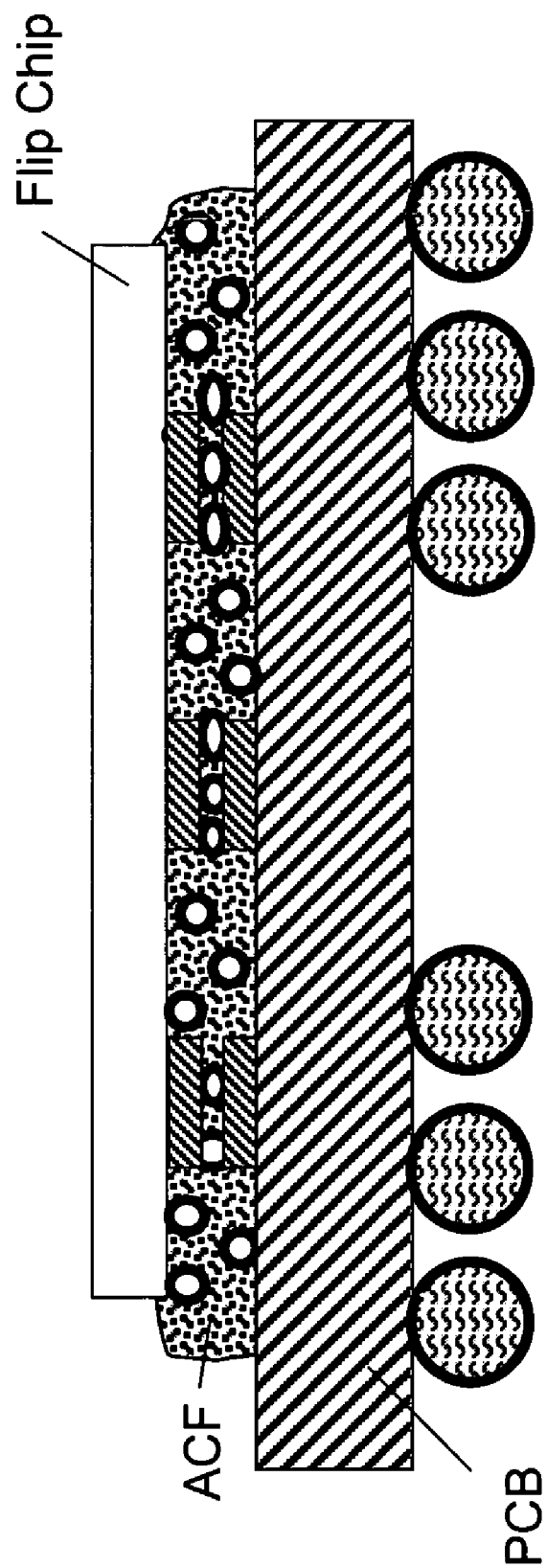

The improved epoxy composition as will be further described below is implemented in an exemplary embodiment as conductive coating or adhesive for an anisotropic conductive film (ACF) as that shown in FIGS. 1A to 1D. FIG. 1A shows a typical ACF comprising two release films, an adhesive and conductive particles dispersed therein. FIG. 1B shows an exemplary application of an ACF implemented for providing vertical electrical connections between a top and bottom flexible printed circuit (FPC) or chip on film (COF) packages. FIGS. 1C and 1D show the schematic drawings of some typical ACF applications in connecting electrodes and IC chips. To ensure good electric contacts between the electrodes disposed above and below the ACF, conductive particles formed with rigid metallic spikes extended out from the particle surface may be implemented. These rigid metallic spikes improve the reliability of electric connection between electrodes susceptible to corrosion by penetrating through the corrosive film that may be developed over time on the surface of the electrodes. The improved epoxy composition may further be employed as a conductive coating or adhesive in another exemplary embodiment of an improved ACF includes non-random of conductive particles as shown in FIGS. 2A and 2B. FIG. 2A shows the schematic top view of the ACF and FIG. 2B shows the schematic side cross sectional view along a horizontal line a-a' of the top view. The ACF (100) includes a plurality of conductive particles (110) disposed at predetermined locations in an adhesive layer (120) between a bottom (130) and top substrates (140).

By applying the improved epoxy compositions of this invention in a conductive coating or adhesive layer or layers, the conductive particles either in the random or non-random arrays may be in the adhesive layer, on the adhesive layer or underneath the adhesive layer. Flexible configurations may be conveniently arranged according to particular application requirements. These configurations may include an arrangement where the adhesive that comprises the improved epoxy compositions of this invention and the conductive particles are disposed in separate, adjacent or non-adjacent layer in an ACF of either a random or non-random particle array.

The improved ACF is disclosed in another co-pending patent application Ser. No. 11/418,414 entitled "Non-random Array of An-isotropic Conductive Film (ACF) and Manufacturing Processes". The disclosures made in that patent application is hereby incorporated by reference in this patent application.

Suitable leuco dyes as cocatalysts of the present invention include, but are not limited to, triarylmethane lactones, triarylmethane lactams, triarymethane sultones, fluorans, phthalides, azaphthalides, spiropyrans, spirofluorene phthalides, spirobenzantharacene phthalides. Leuco dyes comprising a N,N-dialkylamino, N,N-diarylamino, N,N-dialkylaryl or N-alkyl-N-aryl-amino, N-alkylamino, or N-arylamino group on the aromatic ring are particularly useful. Useful examples of the leuco dyes include, but are not limited to, compounds represented by the formula (I)-(IX) as shown below:

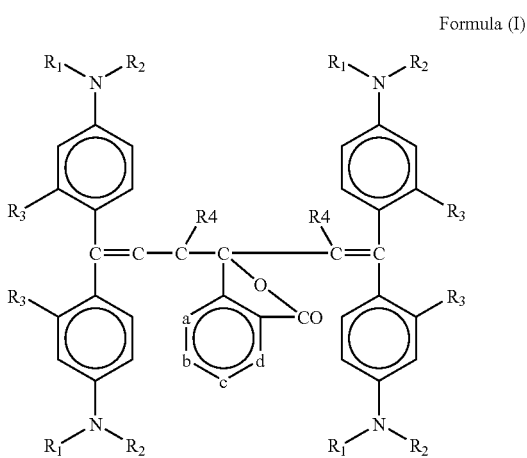

Formula (I)

Wherein each $R_1$, $R_2$ is alkyl, aryl or aryl-alkyl and R1 and R2 may be substituted by halogen, alkoxyl or acetyl, alicyclic, aryl which may be substituted by halogen, alkyl or alkoxyl, aralkyl which may be substituted by halogen, alkyl or alkoxyl, or one or each or both of $R_1$ and $R_2$ together with the adjacent nitrogen may form a heterocyclic ring; $R_3$ is hydrogen, halogen, alkyl, alkoxyl or acyloxy; $R_4$ is hydrogen or alkyl; and each a, b, c, d is carbon or nitrogen atom, but at least two of them are carbon atoms which may be substituted by hydrogen, halogen, alkyl, alkoxyl, dialkylamino or nitro, and a-b, b-c or c-d bond may form a part of another aromatic ring. Z is a hydrogen, halogen, alkyl, aryl, alkylaryl, or arylalkyl, and m is an integral of 1 to 4.

Specific examples of the compounds of the Formula (I) include, but are not limited to, 3,3-bis(1,1-bis(4-dimethylaminophenyl)ethylene-2-yl)-4,5,6,7-tetrachlorophthalide,
3,3-bis(1,1-bis(4-diethylaminophenyl)ethylene-2-yl)-4,5,6,7-tetracholorphthalide,
3,3-bis(1,1-bis(4-dipropylaminophenyl)-ethylene-2-yl)-4,5-6,7-tetrachlorophalide,
3,3-bis(1,1-bis(4-dibutylaminophenyl)ethylene-2-yl)-4,5,6,7-tetrachlorophthalide,
3,3-bis(1,1-bis(4-bischloroethylaminophenyl)ethylene-2-yl)-4,5,6,7-tetrachlorophthalide,
3,3-bis(1,1-bis(4-bisethoxyethyl-aminophenyl)ethylene-2-yl)4,5,6,7-tetrachlorophthalide,
3,3-bis(1,1-bis(4-N-methyl-N-cyclohexylaminophenyl)ethylene-2-yl)-4,5,6,7-tetrachlorophthalide,
3,3-bis(1,1-bis(4-N-methyl-N-phenylaminophenyl)ethylene-2-yl)-4,5,6,7-tetrachlorophthalide,
3,3-bis(1,1-bis(2-methyl-4-diethylaminophenyl)ethylene-2-yl)-4,5,6,7-tetrachlorophthalide,
3,3-bis(1,1-bis(2-methoxy-4-diethylaminophenyl)ethylene-2-yl)-4,5,6,7-tetrachlorophthalide,
3,3-bis(1,1-bis(4-dimethylaminophenyl-1-propene-2-yl)-4,5,6,7-tetrachlorophthalide,
3,3-bis(1,1-bis(4-dimethylaminophenyl)-ethylene-2-yl)-5-pyrrolidinophthalide,
3,3-bis(1,1-bis(4-dimethylaminophenyl)ethylene-2-yl)-6-pyrrolidinophthalide,
3,3-bis(1,1-bis(4-dimethylaminophenyl)ethylene-2-yl)-5,6,-dichlorophthalide,
3,3-bis(1,1-bis(4-dimethylaminophenyl)-ethylene-2-yl)phthalide,
3,3-bis(1,1-bis(4-dimethylaminophenyl)ethylene-2-yl)-5-dimethylaminophthalide,
3,3-bis(1,1-bis(4-dimethylaminophenyl)ethylene-2-yl)-6-dimethylaminophthalide,
3,3-bis(1,1-bis(4-dimethylaminophenyl)ethylene-2-yl)-5-nitrophthalide,
3,3-bis(1,1-bis(4-dimethylaminophenyl)ethylene-2-yl)-6-nitrophthalide,
3,3-bis(1,1-bis(4-diethylaminophenyl)ethylene-2-yl)-5-ethoxyphthalide,
3,3-bis(1,1-bis(4-diethylaminophenyl)-ethylene-2-yl)-6-ethyoxyphthalide,
3,3-bis(1,1-bis(4-dimethylaminophenyl)-ethylene-2-yl)-5-methylphthalide,
3,3-bis(1,1-bis(4-dimethylaminophenyl)ethylene-2-yl)-6-methylphthalide,
3,3-bis(1,1-bis-(4-N-ethyl-N-benzylaminophenyl)ethylene-2-yl)-4,5,6,7-tetrachlorophthalide,
3,3-bis(1,1-bis-(4-N-methyl-N-p-tolylaminophenyl)ethylene-2-yl)-4,5,6,7-tetrachlorophthalide,
3,3-bis(1,1-bis(4-dimethylaminophenyl)ethylene-2-yl)-5,6-benzophthalide,
3,3-bis(1,1-bis(4-dimethylaminophenyl)ethylene-2-yl)-4-azaphthalide,
3,3-bis(1,1-bis(4-dimethylaminophenyl)-ethylene-2-yl)-5-azaphthalide,
3,3-bis(1,1-bis(4-dimethylaminophenyl)ethylene-2-yl)-6-azaphthalide,
3,3-bis(1,1-bis(4-dimethylaminophenyl)ethylene-2-yl)-7-azaphthalide,
3,3-bis(1,1-bis(4-dimethylaminophenyl)ethylene-2-yl)-4,7-diazaphthalide,
3,3-bis(1,1-bis(4-dimethylaminophenyl)ethylene-2-yl)-5,6-benzo-4,7-diazaphthalide,
3,3-bis(1,1-bis(4-pyrrolidinophenyl)-ethylene-2-yl)-phthalide,
3,3-bis(1,1-bis(4-pyrrolidinophenyl)-ethylene-2-yl)-4,5,6,7-tetrachlorophthalide,
3,3-bis(1,1-bis(4-pyrrolidinophenyl)-ethylene-2-yl)-5-nitrophthalide,
3,3-bis(1,1-bis(4-pyrrolidinophenyl)ethylene-2-yl)-6-nitrophthalide,
3,3-bis(1,1-bis(4-pyrrolidinophenyl)-ethylene-2-yl)-5-ethoxyphthalide,
3,3-bis(1,1-bis(4-pyrrolidinophenyl)ethylene-2-yl)-6-ethoxyphthalide,
3,3-bis(1,1-bis(4-pyrrolidinophenyl)ethylene-2-yl)-5-methylphthalide,
3,3-bis(1,1-bis(4-pyrrolidinophenyl)-ethylene-2-yl)-6-methylphthalide,
3,3-bis(1,1-bis(4-pyrrolidinophenyl)ethylene-2-yl)-5-pyrrolidinophthalide,
3,3-bis(1,1-bis(4-pyrrolidinophenyl)ethylene-2-yl)-6-pyrrolidinophthalide,
3,3-bis(1,1-bis(4-pyrrolidinophenyl)ethylene-2-yl)-5,6-dichlorophthalide,
3,3-bis(1,1-bis(4-piperidinophenyl)ethylene-2-yl)phthalide,
3,3-bis(1,1-bis(4-piperidinophenyl)ethylene-2-yl)-5-dimethylaminophthalide,
3,3-bis(1,1-bis(4-piperidinophenyl)ethylene-2-yl)-6-dimethylaminophthalide,
3,3-bis(1,1-bis(4-piperidinophenyl)ethylene-2-yl)-4,5,6,7-tetrachlorophthalide,
3,3-bis(1,1-bis(4-morpholinophenyl)ethylene-2-yl)-4,5,6,7-tetrachlorophthalide,
3,3-bis(1,1-bis(4-hexamethyleneiminophenyl)ethylene-2-yl)-4,5,6,7-tetrachlorophthalide,
3,3-bis(1,1-bis(2-methyl-4-pyrrolidinophenyl)-ethylene-2-yl)-4,5,6,7-tetrachlorophthalide, 3,3-bis(1,1-bis(2-methoxy-4-pyrrolidinophenyl)ethylene-2-yl)-4,5,6,7-tetrachlorophthalide,
3,3-bis(1,1-bis(2-acetoxy-4-pyrrolidinophenyl)-ethylene-2-yl)-4,5,6,7-tetrachlorophthalide,
3,3-bis(1,1-bis(4-pyrrolidinophenyl)-1-propene-2-yl)-4,5,6,7-tetrachlorophthalide,
3,3-bis(1,1-bis(1-methyl-1,2,3,4-tetrahydroquinoline-4-yl)-ethylene-2-yl)-4,5,6,7-tetrachlorophthalide,
3,3-bis(1,1-bis(julolidine-5-yl)ethylene-2-yl)-4,5,6,7-tetrachlorophthalide,
3,3-bis(1,1-bis(4-N-methyl-N-chloroethylaminophenyl)-ethylene-2-yl)-4,5,6,7-tetrachlorophthalide,
3,3-bis(1,1-bis(4-N-ethyl-N-chloroethylaminophenyl)ethylene-2-yl)-4,5,6,7-tetrachlorophthalide,
3,3-bis(1,1-bis(4-N-methyl-N-methoxyethylaminophenyl)ethylene-2-yl)-4,5,6,7-tetrachlorophthalide,
3,3-bis(1,1-bis(4-N-ethyl-N-ethoxyethylaminophenyl)ethylene-2-yl)-4,5,6,7-tetrachlorophthalide,
3,3-bis(1,1-bis(4-N-methyl-N-2,3-dimethoxypropylaminophenyl)ethylene-2-yl)-4,5,6,7-tetrachlorophthalide,
3,3-bis(1,1-bis(4-N-ethyl-N-2,3-dimethoxypropylaminophenyl)ethylene-2-yl)-4,5,6,7-tetrachlorophthalide and the like.

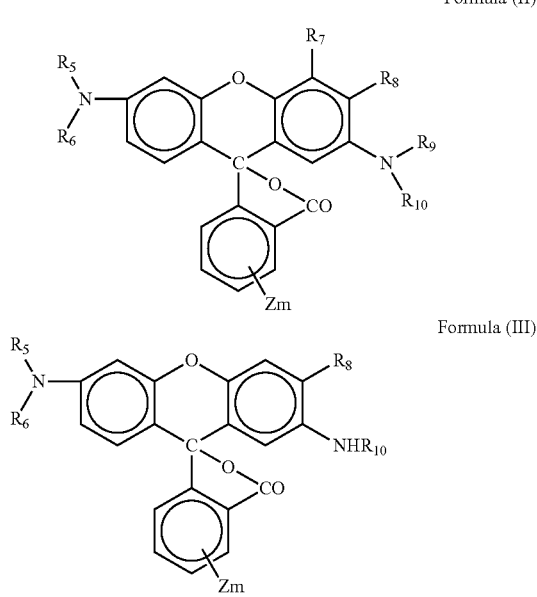

Formula (II)

Formula (III)

Wherein each $R_5$, $R_6$ is alkyl which may be substituted by halogen or alkoxyl, unsaturated alkyl, alicyclic, aryl which may be substituted by halogen, alkyl or alkoxy, aralkyl which may be substituted by halogen, alkyl or alkoxyl, or both of $R_5$ and $R_6$ together with the adjacent nitrogen may form a heterocyclic ring; each $R_7$, $R_8$ is hydrogen, alkyl, halogen or alkoxy; each $R_9$, $R_{10}$ is hydrogen, alkyl which may be substituted by halogen, alkoxyl, alkoxycarbonyl or dialkylamino, alicyclic, aryl which may be substituted by halogen, alkyl, alkoxyl, halogenated alkyl, alkoxycarbonyl or dialkylamino, or aralkyl which may be substituted by halogen, alkyl, alkoxyl, halogenated alkyl, alkoxycarbonyl or dialkylamino; and X is hydrogen, alkyl or halogen. Z is a hydrogen, halogen, alkyl, aryl, alkylaryl, or arylalkyl, and m is an integral of 1 to 4. $R_{23}$ is the same as described above as $R_9$ and $R_{10}$.

Specific examples of the compounds of the Formula (II) and (III) include, but are not limited to, 3-diethylamino-6-methyl-7-anilinofluoran,
3-diethylamino-6-methyl-7-toluidinofluoran,
3-diethylamino-6-methyl-7-xylidinofluoran,
3-diethylamino-6-methyl-7-mesitidinofluoran,
3-diethylamino-6-methyl-7-(p-butylanilino)fluoran,
3-diethylamino-6-methyl-7-anisidinofluoran,
3-diethylamino-6-methyl-7-p-phenetidinofluoran,
3-dimethylamino-6-methyl-7-anilinofluoran,
3-dipropylamino-6-methyl-7-anilinofluoran,
3-di(.beta.-ethoxyethyl)-amino-6-methyl-7-anilinofluoran,
3-di(chloroethyl)amino-6-methyl-7-anilinofluoran,
3-dibenzylamino-6-methyl-7-anilinofluoran,
3-N-methyl-cyclohexylamino-6-methyl-7-anilinofluoran,
3-N-allyl-N-n-pentylamino-6-methyl-7-anilinofluoran,
3-pyrrolidino-6-methyl-7-anilinofluoran,
3-piperidino-6-methyl-7-anilinofluoran,
3-piperidino-6-methyl-7-toluidinofluoran,
3-piperidino-6-methyl-7-(p-butylanilino)fluoran,
3-methylpiperidino-6-methyl-7-(p-butylanilino)fluoran,
3-morpholino-6-methyl-7-(p-butylanilino)fluoran,
3-(N-methyl-anilino)-6-methyl-7-anilinofluoran,
3-(N-ethyl-anilino)-6-methyl-7-anilinofluoran,
3-(N-benzyl-anilino)-6-methyl-7-anilinofluoran,
3-(N-ethyl-p-toluidino)-6-methyl-7-anilinofluoran,
3-(N-ethyl-p-chloroanilino)-6-methyl-7-anilinofluoran,
3-(N-ethyl-anilino)-6-methyl-7-(p-toluidino)fluoran,
3-(N-ethyl-p-toluidino)-6-methyl-7-(p-toluidino)fluoran,
3-N-benzyl-xylidino-6-methyl-7-(p-toluidino)fluoran,
3-(N-chloroethyl-p-toluidino)-6-methyl-7-xylidinofluoran,
3-N-ethyl-anilino-6-methyl-7-(p-butylanilino)fluoran,
3-dibutyl-amino-6-methyl-7-anilinofluoran,
3-(N-methyl-N-propylamino)-6-methyl-7-anilinofluoran,
3-(N-ethyl-N-i-pentylamino)-6-methyl-7-anilinofluoran,
3-(N-ethyl-N-n-hexylamino)-6-methyl-7-anilinofluoran,
3-hexamethyleneimino-6-methyl-7-anilinofluoran,
3-(2,3-dihydro-isoindole-2-yl)-6-methyl-7-anilinofluoran,
3-diethylamino-6-chloro-7-anilinofluoran,
3-diethylamino-6-bromo-7-anilinofluoran,
3-diethylamino-6-iodo-7-anilinofluoran,
3-diethylamino-6-chloro-7-ethoxyethylaminofluoran,
3-diethylamino-6-chloro-7-chloropropylaminofluoran,
3-diethylamino-6-chloro-7-cyclohexylaminofluoran,
3-diethylamino-1,6-dimethyl-7-anilinofluoran,
3-diethylamino-4-chloro-6-methyl-7-anilinofluoran,
3-diethylamino-7-(o-chloroanilino)-fluoran,
3-dibutylamino-7-(o-chloroanilino)fluoran,
3-diethylamino-7-(o-bromoanilino)fluoran,
3-dibutylamino-7-(o-fluoroanilino)fluoran,
3-diethylamino-7-(o-methoxycarbonylphenyl-amino)fluoran,
3-diethylamino-7-(o-(i-pentyloxy)carbonylphenylamino)fluoran,
3-diethylamino-7-diphenylaminofluoran,
3-diethylamino-7-bis(.alpha.-phenylethyl)-aminofluoran,
3-diethylamino-5,6-dimethyl-7-anilinofluoran,
3-diethylamino-5-chloro-6-methyl-7-anilinofluoran,
3-dibutylamino-6-methyl-7-(p-chloroanilino)fluoran,
3-diethylamino-7-(m-trifluoromethylanilino)fluoran,
3-dibutylamino-7-(p-trifluoromethylanilino)-fluoran,
3-diethylamino-7-(N-methyl-trifluoromethylanilino)-fluoran,
3-dimethylamino-7-trifluoromethylanilinofluoran,
3-dimethylamino-7-(N-methyl-trifluoromethylanilino)fluoran,
3-dimethylamino-7-(N-ethyl-trifluoromethylamino)fluoran, 3-dimethylamino-7-(N-benzyl-trifluoromethylanilino)fluoran,
3-diethylamino-5-methyl-7-trifluoromethylanilinofluoran,
3-diethylamino-5-ethyl-7-trifluoromethylanilinofluoran,
3-diethylamino-5-chloro-7-trifluoromethylanilinofluoran,
3-diethylamino-5-methyl-7-(N-methyl-trifluoromethyla-nilino)-fluoran,
3-diethylamino-6-methylfluoran,3-diethylamino-7-methylfluoran,
3-diethylamino-7-chlorofluoran,3-diethylamino-6,8-dimethylfluoran,
3-diethylamino-7-phenylfluoran,
3-diethylamino-5-mehtyl-7-t-butylfluoran,
3-diethylamino-6-methyl-7-chlorofluoran,
3-diethylamino-7-methoxyfluoran,
3-cyclohexylamino-7-methylfluoran,
3-cyclohexylamino-6-chlorofluoran,
3-benzylamino-6-chlorofluoran,
3-diethylamino-7-chlorofluoran,
3-diethylamino-7,8-benzofluoran,
3-diethylamino-6-methoxyfluoran,
3-diethylamino-7-(N-methyl-N-acetyl)aminofluoran,4-benzylamino-8-diethylamino-benzo(a)fluoran,
3-anilino-8-diethylamino-benzo(a)fluoran,
3,6-bis(diethylamino)fluoran-r-anilinolactam,
3,6-bis(diethylamino)fluoran-r-o-chloroanilinolactam.

Specific examples of the compounds of Formula (IV) include, but are not limited to,
3,3-bis(1-ethyl-2-methylindole-3-yl)phthalide,
3,3-bis(1-octyl-2-methylindole-3-yl)phthalide,
3,3-bis(1-ethyl-2-methylindole-3-yl)-7-azaphthalide,
3-(4-diethylamino-2-hydroxy)phenyl-3-(2-methoxy-4-methyl-5-anilino)phenylphthalide,
3-(4-pyrrolidino-2-hydroxy)-phenyl-3-(2-methoxy-4-methyl-5-anilino)phenylphthalide,
3-(4-N-methyl-N-cyclohexylamino-2-hydroxy)phenyl-3-(2-methoxy-4-methyl-5-anilino)phenylphthalide,
3-(4-N-ethyl-N-i-pentylamino-2-hydroxy)phenyl-3-(2-methoxy-4-methyl-5-anilino)-phenylphthalide,
3-(N-ethyl-N-p-tolylamino-2-hydroxy)phenyl-3-(2-methoxy-4-methyl-5-anilino )phenylphthalide,
3-(4-diethylamino-2-hydroxy)phenyl-3-(2-methoxy-4-chloro-5-anilino)-phenylphthalide,
3-(4-diethylamino-2-hydroxy)phenyl-3-(2-methoxy-4-chloro-5-ethoxyethylamino)-phenylphthalide,
3-(4-diethylamino-2-hydroxy)phenyl-3-(2-methoxy-5-m-trifluoromethylanilino)phenylphthalide,
3-(4-dibutylamino-2-hydroxy)-phenyl-3-(2-methoxy-5-o-chloroanilino)phenylphthalide.

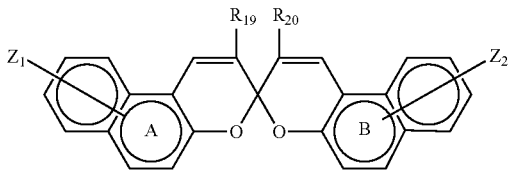

Formula (V)

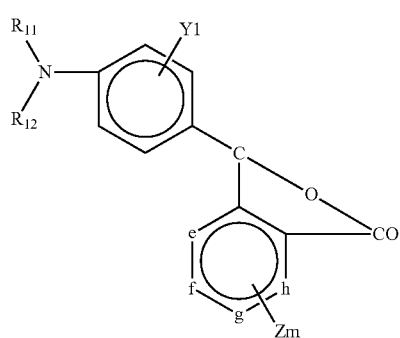

Formula (IV)

wherein each $R_{19}$, $R_{20}$ is hydrogen, alkyl which may be substituted by halogen or alkoxyl, arylalkyl which may be substituted by alkyl, halogen or alkoxyl, phenyl which may be substituted by alkyl, halogen or alkoxyl, or R.sub.19 together with R.sub.20 may form alkylene; each Z.sub.1, Z.sub.2 is hydrogen, halogen, alkyl, alkoxyl or —$NR_{21}R_{22}$ (each $R_{21}$, $R_{22}$ is alkyl which may be substituted by halogen or alkoxyl, unsaturated alkyl, alicyclic, aryl which may be substituted by halogen, alkyl or alkoxyl, aralkyl which may be substituted by halogen, alkyl or alkoxyl, or both of $R_{21}$ and $R_{22}$ together with the adjacent nitrogen may form a heterocyclic ring); and each A, B is benzene or naphthalene ring.

Specific examples of the spiropyran compounds of Formula (V) include, but are not limited to, 1',3'-dihydro-1',3',3'-trimethyl-spiro(2H-1-benzo-pyran-2,2'-(2H)-indole), 1',3'-dihydro-1',3',3'-trimethyl-7-diethyl-amino-spiro(2H-1-benzopyran-2,2'-(2H)-indole), 2-ethoxy-spiro(4H-1-benzothiopyran-4,3'-(3H)naphtho-(2,1-b)pyran), 2-methyl-4-4-ethylthio-1,2-dihydrophthalazino-1,2'-spiro-6'-nitro-2H-1-benzopyran, 2,2'-spiro-di(2H-1-benzopyran), 2,2'-spiro-di((2H)-naphtho-(2,1-b)-pyran), 3'-methyl-2,2'-spiro-di((2H)-naphtho-(2,1-b)pyran), 3-benzyl-2,2'-spiro-di((2H)-naphtho-(2,1-b)-pyran), 3-octyl-2,2'-spiro-di((2H)-naphtho-(2,1-b)pyran), 3,3'-trimethylene-2,2'-spiro-di((2H)-naphtho-(2,1-b)-pyran), spiro-(2H-1-benzopyran)-2,2'-((2H)-naphtho-(2,1 -b)-pyran), 10-chlorospiro(2H-1-benzopyran)-2,2'-((2H)-naphtho-(2,1-b)pyran), 3'-phenyl-7-dimethylamino-2,2'spiro-di(2H-1-benzopyran), 3'-phenyl-7-diethylamino-2,2'-spiro-di(2H-1-benzopyran), 3'-phenyl-7-diethylamino-spiro-(2H-1-benzopyran)-2,2'-((2H)-naphtho-(2,1-b)-pyran), 3'-phenyl-6'-chloro-7-diethylamino-2,2'-spiro-di-(2H-1-benzopyran), 3-phenyl-3'-ethyl-7-

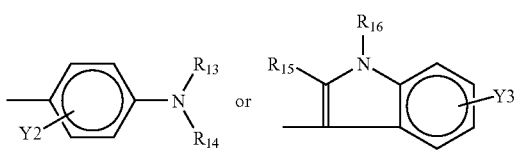

Wherein each $R_{11}$, $R_{12}$ is alkyl. aryl, alkylaryl, unsaturated alkyl, or aryl. Each $R_{11}$, $R_{12}$ may be substituted by halogen or alkoxyl, unsaturated alkyl, alicyclic, aryl which may be substituted by halogen, alkyl or alkoxyl, aralkyl which may be substituted by halogen, alkyl or alkoxyl, or both of $R_{11}$ and $R_{12}$ together with the adjacent nitrogen may form a heterocyclic ring; $Y_1$ is hydrogen, alkyl, alkoxyl or halogen; R is wherein each $R_{13}$, $R_{14}$ is the same as described above as $R_{11}$ and $R_{12}$, each $Y_2$, $Y_3$ is the same as described above as $Y_1$ and $R_{15}$ is alkyl or aryl and $R_{16}$ is hydrogen or alkyl; each e, f, g, h is carbon or nitrogen atom but at least two of them are carbon atoms which may be substituted by hydrogen, alkyl, alkoxyl, halogen or —$NR_{17}R_{18}$ (each $R_{17}$, $R_{18}$ is the same as described above as $R_{11}$ and $R_{12}$) and e-f, f-g or g-h bond of which may form a part of another aromatic ring.

diethylamino-2,2'-spiro-di-(2H-1-benzopyran), 3,3'-diphenyl-7-diethylamino-2,2'-spiro-di-(2H-1-benzopyran), 3'-(p-tolyl)-7-diethylamino-2,2'-spiro-di-(2H-1-benzopyran), 3-phenyl-7,7'-bis-diethylamino-2,2'-spiro-di-(2H-1-benzopyran), 3'-phenyl-7-dibenzylamino-7'-dimethylamino-2,2'-spiro-di(2H-1-benzopyran), 3'-isopropyl-7,7'-bis-dimethylamino-spiro-di-(2H-1-benzopyran), 3,3'-trimethylene-7,7'-bis-dimethylamino-2,2'-spiro-di-(2H-1-benzopyran), 3,3'-(2-t-butyltrimethylene)-7,7'-diethylamino-2,2'-spiro-di-(2H-1-benzopyran), 3'-methyl-7-(N-methyl-N-p-tolyl)amino-2,2'-spiro-di-(2H-1-benzopyran), 3'-benzylamino-7-(N-methyl-N-p-chloroanilino)-2,2'-spiro-di-(2H-1-benzopyran), 3'-methyl-7-pyrrolidino-2,2'-spiro-di-(2H-1-benzopyran), 3'-methyl-7-morpholino-2,2'-spiro-di-(2H-1-benzopyran), 3'-phenyl-8'-methoxy-7-diethylamino-2,2'-spiro-di-(2H-1-benzopyran).

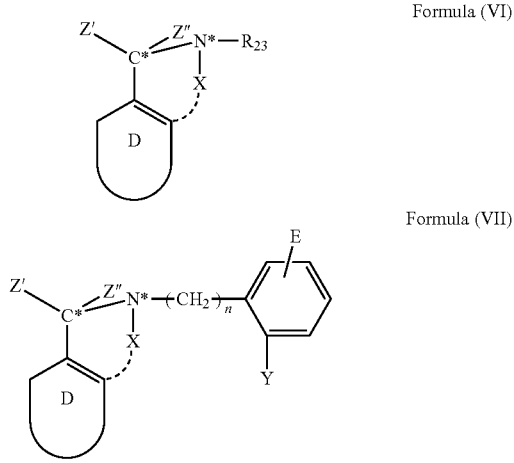

Formula (VI)

Formula (VII)

Wherein ring D in Formula (VI) and (VII) represents a carbocyclic aryl ring, e.g., of the benzene or naphthalene series or a heterocyclic aryl ring, e.g., pyridine or pyrimidine; C* represents the meso carbon atom; X represents —CO—, —SO$_2$— or —CH$_2$—; R$_{23}$ represents a alkyl, aryl, arylalkyl; Y, E, Z' and Z" individually represent a hydrogen, a substituent group, particularly a N,N-dialkylamino group, a nitrogen, oxygen or sulfur atom or a group of atoms containing nitrogen, oxygen or sulfur; and n represents an integral number, preferably between 1 and 12.

In the triarylmethane compounds represented in Formula (VI-1) and (VI-2) above, the aryl moieties Z' and Z", when taken individually, may be the same or different and typically represent heterocyclic aryl groups containing nitrogen, oxygen or sulfur as the heterocyclic atom, particularly N-heterocyclic aryl groups such as julolidin-3-yl, indol-3-yl, pyrr-2-yl, carbazol-3-yl, and indolin-5-yl wherein the N atom of the indolyl, pyrryl, carbazolyl and indolinyl groups may be substituted with hydrogen or alkyl having 1 to 6 carbon atoms, or the aryl moieties Z' and Z" typically may be carbocyclic aryl, particularly phenyl or naphthyl groups. Typically, Z' and Z" when taken together represent aryl groups bridged by a heteroatom, such as, oxygen, sulfur or nitrogen to form, for example, 4H-chromeno[2,3-C]pyrazole and particularly represent carbocyclic aryl groups, such as, phenyl groups bridged with a heteroatom, preferably oxygen, sulfur or nitrogen substituted with hydrogen or an alkyl group having 1 to 6 carbon atoms to provide a xanthene, thioxanthene or an acridine dye, which dyes possess an auxochromic substituent(s) para to the meso carbon atom, i.e., in the 3-position or in the 3,6-positions or meta and para to the meso carbon atom, i.e., in the 3,7-positions.

In the diarylmethane compounds represented in Formula (VI), one of Z' and Z" may be heterocyclic aryl or carbocyclic aryl as discussed above and the other of Z' and Z" may be, for example, phenoxy, thiophenoxy, alkoxy containing 1 to 20 carbon atoms, alkylthio containing 1 to 20 carbon atoms, —N,N-(disubstituted)amino wherein each said substituent may be alkyl containing 1 to 20 carbon atoms, carbocyclic aryl containing 6 to 12 carbon atoms, aralkyl containing 7 to 15 carbon atoms particularly phenyl- and naphthyl-substituted alkyl or alkaryl containing 7 to 15 carbon atoms particularly alkyl-substituted phenyl and naphthyl. Representative alkyl groups include methyl, butyl, hexyl and octadecyl and representative aryl groups include phenyl and naphthyl. Representative alkaryl groups include p-octylphenyl, o-methylnaphthyl and p-hexylphenyl, and representative aralkyl groups include phenethyl, benzyl and naphthylmethyl.

Specific examples of leuco dyes represented by Formula (VI) include, but are not limited to, the leuco dyes described in U.S. Pat. Nos. 4,720,449, 4,960,901 and 5,227,499 such as:

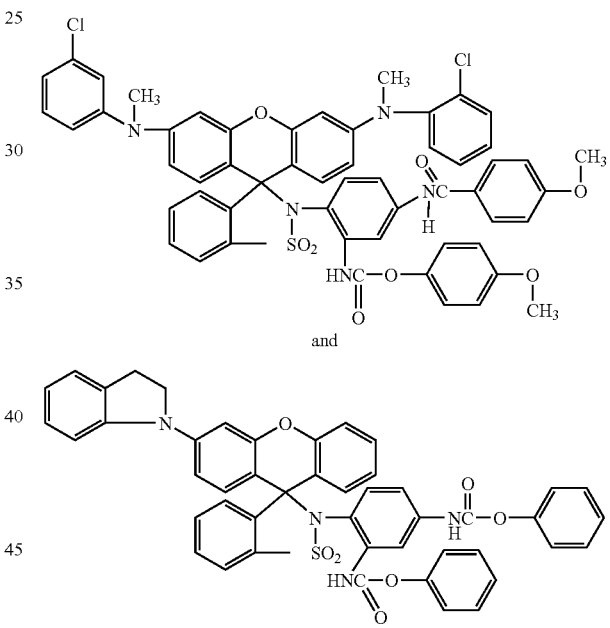

Some of the particularly useful and commercially available examples include, but are not limited to, leuco crystal violet lactone, and the dialkylamino substituted leuco dyes from Hilton Davis, Cinn. Ohio, (Copikem series), Yamada Chemicals, Japan, Sofix Corp., Chattanooga, Tenn. and Ciba Specialty Chemicals, NY. All of the above mentioned leuco dyes have shown significant improvement in the curing kinetics as evident from their differential scanning calorimetry (DSC) thermograms.

Additional examples of the particularly useful N,N-dialkylamino substituted leuco lactone or lactam dyes for this invention include, but are not limited to, triphenyl methane leuco dyes such as 3,3-bis(p-dialkylaminophenyl)-phthalide, 3,3-bis(p-dialkylaminophenyl)-6-dialkyllaminophthalide, 3,3-bis(p-dialkylaminophenyl)-6-chlorophthalide, 3-cyclohexylamino-6-chorofluoran, 3-(N,N-dialkylamino)-5-alkyl-7-(N,N-dialkylamino)fluoran, 3-(N,N-dialkylamino)-5-alkyl-7-(N,N-diarylamino)fluoran, 3-(N,N-dialkylamino)-5-alkyl-7-

(N,N-dialkylarylamino)fluoran, 3-dialkylamino-5-7-dialkylfluoran, 3-dialkylamino-7-alkylfluoran, 3-dialkylamino-5-alkyl-7-alkylfluoran, 3-dialkylamino-7-cholrofluoran, 3-dialkylamino-6-alkyl-7-cholrofluoran, 3-pyrrolidino-6-alkyl-7-chlorofluoran, 3-dialkylamino-6-alkyl-7-anilinofluoran, 2-(N-(3'-trifluoromethylphenyl)amino)-6dialkylaminofluoran, 3-dialkylamino-7-cyclohexylaminofluoran, 2-(3-6-bis(dialkylamino)-9-(o-chloroanilinoxyanthylbenzoic acid lactam), 3-diaalkylamino-6-alkyl-7-anilinofluoran, 3-dialkylamino-6-alkyl-7-p-alkylanilinofluoran, 3-dialkylamino-6-alkyl-7-(o,p-dialkylanilino)fluoran, 3-pyrrolidino-6-alkyl-7-anilinofluoran, N-alkyl-spirobenxopyran such as spirospiroindolinobenzopyrans and N-alkyl-spironaphthooxazines, N-alkyl-spirothiolpyrans.

Still additional examples of useful N,N-dialkylamino substituted leuco dyes including lactones, lactams, fluorans, phthalides, azaphthalide, spiropyrans, spirofluorene phthalides, spirobenzantharacene phthalides for this invention may be found in for examples, U.S. Pat. Nos. 4,343,885, 5,470,816, 6,031,021, and Ch. 1, 4, 5 and 6 "Chemistry and Applications of Leuco Dyes", Plenum Press, edited by R. Muthyala, (1997).

To further improve the curing characteristics, a group of secondary co-catalyst or co-curing agent is also disclosed. The secondary co-catalysts or co-curing agents showed a significant synergistic effect with the leuco dyes of the present invention particularly in the rate of reaction as indicated by the onset and peak temperature of exothermic peak in DSC thermogram. It was found that significant improvements in reaction kinetics could be achieved by incorporating in the e;oxy composition about 0.01% to about 8%, more preferably 0.05% to 5%, by weight of a secondary co-catalyst or co-curing agent selected from a group consisting of ureas, urethans, biurets, allophanates, amides and lactams comprising a N N,N-dialkylamino, N,N-diarylamino, N-alkyl-N-aryl-amino or dicycloalkylamino functional group. Useful examples include amide such as N-(3-(dimethyamino)propyl)lauramide, lactams such as 1,2-benzisothiazol-3(2H)-one, and benzothiazols such as 2-(2-benzothiazolylthio)ethanol. To further improve the connection reliability and consistency of the curing kinetics, less diffusive derivatives, dimers or oligomers of the above mentioned co-catalysts have been found particularly useful. Not to be bound by the theory, it was believed that the increasing molecular weight or improving its compatibility with the epoxide resin can effectively reduce the mobility of the co-catalyst to migrate out of the adhesive film during aging and resulted in a better environmental stability. Examples of the less diffusive co-catalysts include, but are not limited to, the compounds represented by the generic formula (VIII) listed below:

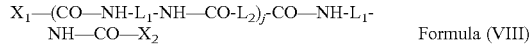

Formula (VIII)

Wherein j is an integral preferably between 0-100, more preferably between 0-10; $L_1$ is a linking groups such as alkylene, arylene and their cyclic, unsaturated or heteratom derivatives; $L_2$ is a linking group such as alkylene, arylene, —(O-$L_3$-O)—, —(O-$L_3$-O)$_k$—, and their cyclic, unsaturated or heteratom derivatives; k is an integral, preferable between 1-100, more preferably between 1-30; $L_3$ is a linking group such as alkylene, arylene, and their cyclic or heteratom derivatives; $X_1$— or $X_2$— independently is an end group such as $R_{25}$—, $R_{25}$ O—, $R_{25}$—S—, $R_{25}$NH—, $R_{25}R_{26}$N—, wherein $R_{25}$ and $R_{26}$ are independently alkyl, aryl, alkylaryl, arylalkyl and their cyclic or heteroatom derivatives; at least one of $R_{25}$ and $R_{26}$ comprises a N,N-dialkylamino or N-alkyl-N-arylamino functional group, particularly a N,N-dimethylamino group. Preferably the co-catalysts or co-curing agent have a molecular weight of more than 300, more preferably more than 500. Examples of co-catalysts represented by the Formula (VIII) include, but are not limited to, the specific compounds listed below:

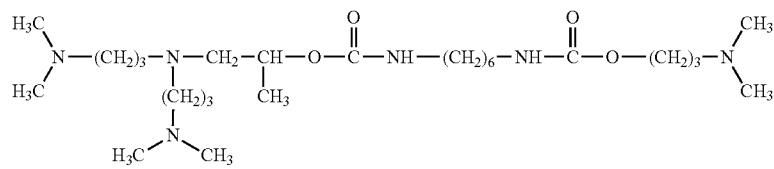

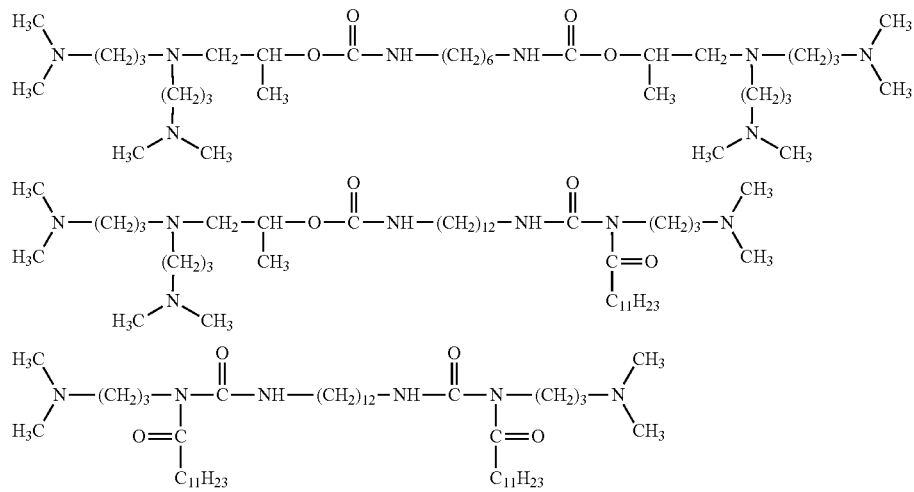

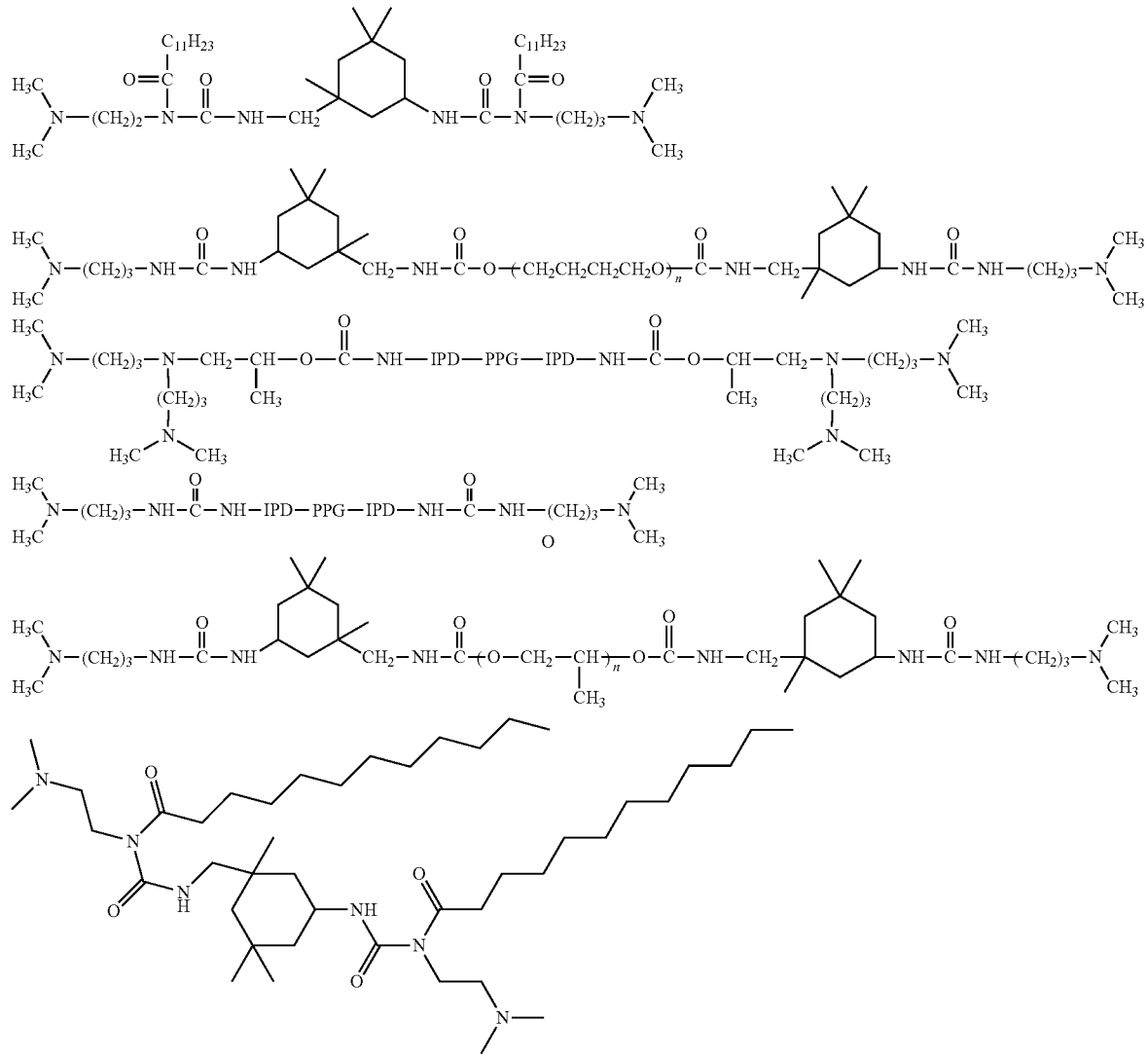

Wherein -PPG- is —(CH$_2$CHCH$_3$O)$_k$—; k is an integral as defined above, preferable between 1-100, more preferably between 1-30; and -IPDI- is

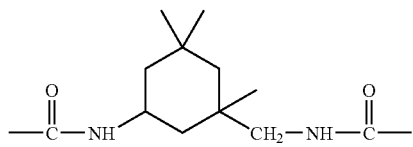

Procedures of the synthesis of some of the preferable dimeric and oligomeric co-catalysts of the present invention are included in the Examples of this disclosure. The molecular weight of the co-catalysts or co-curing agents of the present invention may be increased by chain extension with a polyol, preferably a polyether polyol or a polyester polyol having a molecular weight no less than 200.

Typical Epoxy Adhesives and Molding Compounds

Typical examples of epoxides or epoxy resins used in adhesives or molding compounds include polyglycidyl ethers of polyhydric phenols such as bisphenol epoxy resins derived from epichlorohydrin and bisphenol A or bisphenol F, and epoxy novolak resins derived from epichlorohydrin and phenol novolak or cresol novolak. Other examples include polyglycidyl esters of polycarboxylic acids, alicyclic epoxy compounds, polyglycidyl ethers of polyhydric alcohols, and polyglycidyl compounds of polyvalent amines. These compounds may be partly modified in the structure, e.g., with urethane, nitrile rubber or silicone. Additional examples of suitable epoxy resins are found in, for examples: J. K. Fink, "Reactive Polymers, Fundamentals and Applications", William Andrew Publishing, NY (2005); J. A. Brydson, "Plastic Materials", Ch. 26, 7th ed., Butterworth-Heinemann (1999); H. Lee, "The Epoxy Resin Handbook", McGraw-Hill, Inc., NY (1981); and C. D. Wright and J. M. Muggee in S. R. Hartshorn, ed., "Structure Adhesives", Ch. 3, Plenum Press, NY (1986).

The curing agents or accelerators typically used in epoxy adhesives or molding compounds include polyamide-polyamine-based compounds, aromatic polyamine compounds, imidazole compounds, tetrahydrophthalic anhydride and the like. The accelerator or curing agent may be liquid or solid. Preferred liquid accelerators include, e.g., amine compounds, imidazole compounds and mixtures thereof. Exemplary liquid accelerator compounds include 1-(2-hydroxyethyl)imidazole, 2-methylimidazole, 2-ethyl-4-methylimidazole, 1-benzyl-2-methylimidizole, 1-cyanoethyl-2-phenyl-4, 5-dihydroxymethyl imidazole, 1-(2-hydroxyethyl)imidazole, 2-ethyl-4-methylimidazole, phenylimidazole, 2-phenyl-4-methylimidazole, 1-cyanoethyl-2-phenylimidazole, multifunctional mercaptans (e.g., Anchor 2031), and stannous octate. Preferred solid accelerators include, e.g., urea, 2-phenyl-4,5-dihydroxymethyl imidazole, and 1-(2-hydroxyethyl)imidazole.

The epoxy adhesive may comprise a filler or additive to control one or more properties of the epoxy adhesive such as rheology, wetting and moisture resistance. A particulate rheology modifier may be added to the epoxy adhesive. Preferably, the rheology modifier is a thixotropic agent having an average particle size between about 0.001 and about 10 microns, and more preferably between about 0.01 and about 5 microns. Examples of particulate rheology modifiers include barium sulfate, talc, aluminum oxide, antimony oxide, kaolin, finely divided silicon dioxide which may be colloidal or rendered hydrophobic, micronized talcum, micronized mica, clay, kaolin, aluminum oxide, aluminum hydroxide, calcium silicate, aluminum silicate, magnesium carbonate, calcium carbonate, zirconium silicate, porcelain powder, glass powder, antimony trioxide, titanium dioxide, barium titanate, barium sulfate and mixtures thereof. One particularly preferred rheology modifier is fumed silica such as Cab-O-Sil M-5 from Cabot Corp., MA.

To improve the ability of the epoxy adhesive to wet a surface a wetting agent may be added. Exemplary wetting agents include surfactants such as epoxy silanes, branch or block copolymers of siloxanes, fluoro-surfactants and hydrocarbon-type surfactants. Suitable surfactants include FC4430 (formally referred to as FC-430) which is available from 3M Corp. of St. Paul Minn., Silwet series from GE Silicones-OSi Specialties, BYK 322, BYK325 and BYK 631N from BYK-Chemie.

The moisture resistance may be improved by including a coupling agent in the epoxy adhesive. Typical coupling agents include organic metal compounds that comprise chromium, silane, titanium, aluminum and zirconium. The most commonly used coupling agents comprise silane such as vinyl-triethoxysilane, vinyltris(2-methoxyethoxy)silane, 3-methacryloxypropyltrimethoxysilane, 3-glycidoxypropyl-trimethoxysilane, 2.-(3,4-epoxycyclohexyl)ethyltrimethoxy silane, N-2-(aminoethyl)-3-aminopropylmethyldimethoxy-silane, 3.-aminopropyltriethoxysilane, and 3-chloro-propylt-rimethoxy-silane. If present, the coupling agent preferably comprises less than about 1% by weight of the epoxy adhesive.

For prepreg, filament winding and molding compound applications, reinforcement fibers such as glass fiber and carbon fiber are often included in the composition. Nature fibers such as bamboo fibers, wood and other cellulose fibers are also useful. They may be in a pellet form prepared by extrusion followed by cutting or in a sheet form prepared by coating, lamination or impregnation.

The leuco dyes or the secondary co-catalysts of the present invention, alone or combined, are not efficient to initiate the crosslinking or polymerization reactions of epoxides. However, they show very significant synergistic effect in increasing the curing speed and conversion once a latent catalyst/curing agent such as Novacure imidazole microcapsules is activated or released by for example, heat, radiation, pressure or the combination thereof. The preferable concentration range of the latent catalyst/curing agent is from about 0.05% by weight to about 50% by weight, more preferably from about 2% by weight to about 40% by weight based on the adhesive composition. In the case when a microencapsulated latent curing agent such as Novacure imidazole microcapsule is used, the more preferable concentration range is from about 5% by weight to about 40% by weight based on the adhesive composition. As a result, a fast-curing or low-temperature-curing epoxy composition with improved shelf-life stability may be achieved by using the following approaches:

(1) a lower concentration of a latent catalyst/curing agent,
(2) a more stable latent catalyst/curing agent,
(3) a latent catalyst/curing agent with a slower releasing rate, or
(4) a catalyst/curing agent microcapsule with a thicker wall or a wall of better barrier properties for the release of the catalyst or curing agent.

It is evident that the present invention enables a much wider formulation window to achieve an epoxy composition with improved shelf-life stability and/or curing characteristics. For high speed, automatic electronic packaging or device connection applications such as bonding with an ACF, the epoxy composition of present invention enables an improved throughput at a lower operation temperature without tradeoffs in the shelf-life stability.

EXAMPLES

I. Synthesis of Co-catalysts for the Epoxy Adhesives

Example 1

Synthesis of Co-Catalyst (C9-HDI-C9)

A three-necked round bottom flask was equipped with a reflux condenser, an addition funnel, a thermometer, an inert gas inlet and outlet.

A solution of 1.68 grams of 1,6-diisocyanatohexane (HDI) in 15 grams of anhydrous m-xylene was slowly added into the reaction flask containing 6.15 grams of N-(3-(Dimethylamino)propyl)lauramide (C9), 0.83 grams of dibutyltin dilaurate (DBTDL) and 50 grams of m-xylene.

After stirring for one hour at 5° C., the reaction mixture was refluxed overnight. The solvent was then removed by vacuum evaporation to yield the product C9-HDI-C9.

Example 2

Synthesis of Co-Catalyst (BDMAPAP-HDI-C9)

The same reaction set-up as example 1 was used.

A solution of 2.69 grams of HDI in 15 grams of anhydrous m-xylene was slowly added into the reaction flask containing 4.56 grams of C9, 1.32 grams of DBTDL and 50 grams of m-xylene. After stirring at room temperature for one hour, the reaction mixture was kept stirring at 125° C. overnight.

A solution of 3.93 grams of 1-{bis[3-(dimethylamino)propyl]amino}-2-propanol (BDMAPAP) in 12 grams of m-xylene was added into the reaction mixture at room temperature and allowed to react under stirring for 1 hour at room temperature, followed by 5 hours at 125° C. The solvent was then removed by vacuum evaporation to yield the product BDMAPAP-HDI-C9

Example 3

Synthesis of Co-Catalyst
(BDMAPAP-HDI-BDMAPAP)

The same reaction set-up as example 1 was used.
A solution of 1.53 grams of HDI in 15 grams of anhydrous tetrahydrofuran (THF) was slowly added into the reaction flask containing 7.37 grams of BDMAPAP and 60 grams of THF. The reaction mixture was allowed to react with stirring at 5° C. for 1 hour and subsequently refluxed for additional 5 hours. The solvent was removed by vacuum evaporation to yield the product BDMAPAP-HDI-BDMAPAP.

Example 4

Synthesis of Co-Catalyst
(BDMAPAP-HDI-DMAP-OH)

The same reaction set-up as example 1 was used.
A solution of 3.37 grams of HDI in15 grams of anhydrous THF was slowly added into the reaction flask containing 4.91 grams of BDMAPAP and 2.07 grams of 3-dimethylamino-1-propanol (DMAP-OH) and 60 grams of THF. The reaction mixture was allowed to react with stirring at 5° C. for 1 hour and subsequently refluxed for additional 5 hours. The solvent was removed by vacuum evaporation to yield the product BDMAPAP-HDI-DMAP-OH.

Example 5

Synthesis of Co-Catalyst (C9-DDDI-C9)

The same reaction set-up as example 1 was used.
A solution of 2.52 grams of 1,12-diisocyanatododecane (DDDI) in 15 grams of anhydrous m-xylene was slowly added into the reaction flask containing 6.15 grams of C9 and 0.83 grams of DBTDL and 50 grams of m-xylene. The reaction mixture was allowed to react with stirring at 5 ° C. for 1 hour and subsequently refluxed overnight. The solvent was removed by vacuum evaporation to yield the product C9-DDDI-C9.

Example 6

Synthesis of Co-Catalyst (BDMAPAP-DDDI-C9)

The same reaction set-up as example 1 was used.
A solution of 4.04 grams of DDDI in 15 grams of anhydrous m-xylene was slowly added into the reaction flask containing 4.56 grams of C9 and 1.32 grams of DBTDL and 50 grams of m-xylene. After stirring at room temperature for one hour, the reaction mixture was heated at 125° C. overnight. To the resultant reaction mixture, a solution 3.93 grams of BDMAPAP in 12 grams of m-xylene was added at room temperature, allowed to react under stirring at 5° C. for 1 hour and subsequently refluxed for 5 hours. The solvent was removed by vacuum evaporation to yield the product BDMAPAP-DDDI-C9.

Example 7

Synthesis of Co-Catalyst
(BDMAPAP-DDDI-BDMAPAP)

The same reaction set-up as example 1 was used.
A solution of 3.79 grams of DDDI in 15 g of anhydrous THF was slowly added into the reaction flask containing 7.37 grams of BDMAPAP and 60 grams of THF. After stirring for 1 hour at 5° C., the reaction mixture was refluxed for additional 5 hours. The solvent was removed by vacuum evaporation to yield the product BDMAPAP-DDDI-BDMAPAP Example 8

Synthesis of Co-Catalyst
(BDMAPAP-DDDI-DMAP-OH)

The same reaction set-up as example 1 was used.
A solution containing 5.05 grams of DDDI in 15 grams of anhydrous THF was slowly added into the reaction flask containing 4.91 grams of BDMAPAP and 2.07 grams of DMAP-OH and 60 grams of THF. After stirring for 1 hour at 5° C., the reaction mixture was refluxed for additional 5 hours. The solvent was removed by vacuum evaporation to yield the product BDMAPAP-DDDI-DMAP-OH Example 9

Synthesis of Co-Catalyst (C9-IPDI-C9)

The same reaction set-up as example 1 was used.
A solution of 2.22 grams of isophorone diisocyanate (IPDI) in 15 grams of anhydrous m-xylene was slowly added into the reaction flask containing 6.15 grams of C9 and 0.83 grams of DBTDL and 50 grams of m-xylene. After stirring for one hour at 5° C., the reaction mixture was refluxed overnight. The solvent was removed by vacuum evaporation to yield the product C9-IPDI-C9.

Example 10

Synthesis of Co-Catalyst
(BDMAPAP-IPDI-BDMAPAP)

The same reaction set-up as example 1 was used.
A solution of 3.34 grams of IPDI in 15 grams of anhydrous THF was slowly added into the reaction flask containing 7.37 grams of BDMAPAP and 60 grams of THF. After stirring for 1 hour at 5° C., the reaction mixture was refluxed for additional 5 hours. The solvent was removed by vacuum evaporation to yield the product BDMAPAP-IPDI-BDMAPAP

Example 11

Synthesis of Co-Catalyst
(BDMAPAP-API-470-BDMAPAP)

The same reaction set-up as example 1 was used.
A solution of 3.86 grams of BDMAPAP in 15 grams of anhydrous THF was slowly added into the reaction flask containing 10 grams of Airthane API-470 (from Air Products, polyurethane pre-polymer of IPDI and Poly (propylene glycol), 6.60 wt % of —NCO) and 60 grams of THF. After stirring for 1 hour at 5° C., the reaction mixture was refluxed for additional 5 hours. The solvent was removed by vacuum evaporation to yield the product BDMAPAP-API-470-BDMAPAP

Example 12

Synthesis of Co-Catalyst
(DMAPA-API-470-DMAPA)

The same reaction set-up as example 1 was used.
A solution of 2.61 grams of 3-dimethylamino-1-propylamine (DMAPA) in 14 grams of anhydrous THF was slowly added into the reaction flask containing 15 grams of Airthane API-470 and 52 grams of THF. After stirring for 1 hour at 5° C., the reaction mixture was refluxed for additional 5 hours. The solvent was removed by vacuum evaporation to yield the product DMAPA-API-470-DMAPA.

Example 13

Synthesis of Co-Catalyst
(DMAPA-IPDI-Terathane-IPDI-DMAPA)

The same reaction set-up as example 1 was used.
A solution of 6.5 grams of Terathane (Mn~650) in 15 grams of THF was slowly added into the reaction flask containing 4.58 grams of IPDI and 45 grams of THF. After stirring for 90 minutes at 5° C., the reaction mixture was refluxed for 3 hours, then, cooled down overnight. To which, a solution of 2.38 grams of DMAPA in 12 grams of THF was added slowly. After stirring for one hour at 5° C., the reaction mixture was refluxed for 3 hours. The solvent was removed under vacuum evaporation to yield the product DMAPA-IPDI-Terathane-IPDI-DMAPA

Example 14

Synthesis of Co-Catalyst
(DMAPA-IPDI-PPG-IPDI-DMAPA)

The same reaction set-up as example 1 was used.
A solution of 4.0 grams of poly(propylene glycol) (PPG) (Mn~425, 263 mg KOH/g) in 15 grams of THF was slowly added into the reaction flask containing 8.63 grams of IPDI and 50 grams of THF. After stirring for 100 minutes at room temperature, the reaction mixture was refluxed for 3.5 hours, then, cooled down. To which, a solution of 4.41 grams of DMAPA in 12 grams of THF was added slowly. After stirring for one hour at 5° C., the reaction mixture was left overnight with stirring and refluxed for additional 3 hours. The solvent was removed under vacuum evaporation to yield the product DMAPA-IPDI-PPG-IPDI-DMAPA.

Example 15

Synthesis of Co-Catalyst (C9-IPDI-C9)

4.98 grams of N-(3-(dimethylamino)propyl)lauramide (C9) and 0.724 grams of dibutyltin dilaurate were dissolved in 45 grams of anhydrous m-Xylene in a 100 ml flask. A solution containing 1.945 grams of IPDI and 15 grams of m-xylene was added slowly into the reactor with gentle stirring under an Argon atmosphere. The mixture was allowed to react for 1 hour at room temperature followed by 14.5 hours at 105° C. and 9 hours at reflux conditions. The solvent was removed by vacuum evaporation to yield the product C9-IPDI-C9.

Example 16

Synthesis of Co-Catalyst (C9-IPDI-PPG-IPDI-C9)

The N-(3-(dimethylamino)propyl)lauramide dimer (C9-IPDI-PPG-IPDI-C9) was prepared by reacting N-(3-(dimethylamino)propyl)lauramide with API-470 (a polyurethane pre-polymer prepared from IPDI and poly (propylene glycol)) using same procedure as that of Example 1 except HDI was replaced by API-470.

Example 17

Synthesis of Co-Catalyst
(C9-IPDI-Terathane-IPDI-C9)

The N-(3-(dimethylamino)propyl)lauramide dimer (C9-IPDI-Terathane-IPDI-C9) was prepared by reacting N-(3-(dimethylamino)propyl)lauramide with a polyurethane pre-polymer prepared from IPDI and Terathane 650 polyether glycol using same procedure as that of Example 1 except HDI was replaced by polyurethane pre-polymer (Terathane-IPDI).

II. The Adhesive Formulations Comprising Co-catalysts of the Present Invention In addition to the above-mentioned co-catalysts, the ingredient of the exemplary adhesive formulations includes epoxy resin RSL 1462 and RSL 1739 from Hexion Specialty Chemicals, Inc,; Epon 165 (multifunctional epoxide) from Resolution Performance Products, TX, HyPox UA11 (epoxy bisphenal-A modified polyurethane) from CVC Specialty Chemicals, Inc.; Min-U-sil5 (a kind of silica) from Western Reserve Chemical; Cab-O-Sil-M5 from Cabot; Paphen phenoxy resin PKHH (a kind of epoxy binder) from Phenoxy Specialties; Butvar B76 from Solutia, Inc.; BYK322 (a kind of surfactant) from BYK-Chemie USA; crystal violet lactone, N-(3-(Dimethylamino)propyl)lauramide and 1,2-Benzisothiazol-3(2H)-one from Aldrich; and Magenta-20 leuco dye from Hilton Davis, OH; and Novacure microencapsulated imidazole catalyst such as HXA 3932 HP from Asahi Chemical Ind. Co., Ltd.

To facilitate the preparation of coating fluids, the following stock solutions were prepared: 60 parts of Epon 165 were dissolved in 40 parts of isopropyl acetate (i-PrOAc) to form a stock solution of 60% solid; 10 parts of Min-U-Sil5 were dispersed in 90 parts of a solution containing 86.46 parts of i-PrOAc, 3 parts of UA11, 0.14 parts of BYK 322, 0.2 parts of Silquest A186 and 0.2 parts of Silquest A189 to form a stock solution of 13.54% solid; 10 parts of BYK322 were dissolved in 90 parts of i-PrOAc to form 10% stock solution; 36 parts of PKHH were dissolved in a solution containing 25 parts of acetone and 15 parts of i-PrOAc, 11.25 parts of Epicoln 840S and 12.75 parts of Epicoln 830S to form a stock solution of 60% solid; 10 parts of Cab-O-Sil-M5 were dispersed in a solution containing 86.6 parts of i-PrOAc, 3 parts of HyPox UA11, 0.2 parts of Silquest A186 and 0.2 parts of Silquest A189 to form a stock of 13.4% solid.

In all cases, DSC (differential scanning calorimetry) was employed to evaluate the curing kinetics of the epoxy adhesives at a heating rate of 5° C./min with a sample size of about 4 mg.

Example 18A

Crystal Violet Lactone as the Co-catalyst

An adhesive composition containing 13.30 parts of RSL 1462, 15.26 parts of RSL 1739, 20.72 parts of Epon 165, 15.28 parts of HyPox UA 11, 2.50 parts of AlN, 1.28 parts of Min-U-Sil5, 3.00 parts of Cab-O-Sil-M5, 0.3 parts of BYK322, 11.76 parts of Butvar-B76, and 14 parts of HXA 3932 HP latent agent was coated on a release substrate and dried at room temperature. The DSC thermogram of the resultant film showed a $T_{onset}$ (onset temperature of the polymerization/curing peak) at 105.22° C., a $T_{peak}$ (peak temperature of the curing curve) at 127.60° C., and a ΔHp (total heat of polymerization/curing by integration) of 157.2 J/g.

Example 18B

Crystal Violet Lactone as the Co-catalyst

The same composition and procedure of Example 18A were employed except that 3 parts of crystal violet lactone were added into the formulation. The DSC thermogram of the resultant film showed a $T_{onset}$ at 100.46° C., $T_{peak}$ at 125.06° C. and a ΔHp of 233.7 J/g. It is evident that both the rate of curing and the degree of curing or conversion of the epoxide were significantly improved by the addition of crystal violet lactone.

Example 19A

N-(3-(dimethylamino)propyl)lauramide (Co-catalyst C9) as the Co-catalyst

An adhesive composition containing 11.54 parts of RSL 1462, 13.07 parts of RSL 1739, 27.65 parts of Epon 165, 9.44 parts of HyPox UA 11, 9 parts of Min-U-Sil5, 15 parts of PKHH, 0.3 parts of BYK322, and 14 of HXA 3932 HP latent agent was coated on a release substrate and dried at room temperature. The DSC thermogram of the resultant film showed a $T_{onset}$ at 101° C., a $T_{peak}$ at 119° C., and a ΔHp of 275 J/g.

Example 19B

N-(3-(dimethylamino)propyl)lauramide (Co-catalyst C9) as the Co-catalyst

The same composition and procedure of Example 19A were employed except that 3 parts of Co-catalyst C9 were added into the formulation. The DSC thermogram of the resultant film showed a $T_{onset}$ at 77° C., a $T_{peak}$ at 111° C. and a ΔHp of 292 J/g. It is evident that both the rate of curing and the degree of curing or conversion of the epoxide were significantly improved by the addition of 3 parts of Co-catalyst C9.

Example 20A 1,2-Benzisothiazol-3(2H)-one as the Co-catalyst

An adhesive composition containing 11.54 parts of RSL 1462, 13.07 parts of RSL 1739, 27.65 parts of Epon 165, 9.44 parts of HyPox UA 11, 9 parts of Min-U-Sil5, 15 parts of PKHH, 0.3 parts of BYK322, and 14 parts of HXA 3932 HP latent agent was coated on a release substrate and dried at room temperature. The DSC thermogram of the resultant film showed a $T_{onset}$ at 101° C., a $T_{peak}$ at 119° C. and a ΔHp of 275 J/g.

Example 20B 1,2-Benzisothiazol-3(2H)-one as the Co-catalyst

The same composition and procedure of Example 20A were employed except that 1 part of 1,2-benzisothiazol-3 (2H)-one was added into the formulation. The DSC thermogram of the resultant film showed a $T_{onset}$ at 95° C., a $T_{peak}$ at 117° C. and a ΔHp of 294 J/g. It is evident that both the rate of curing and the degree of curing or conversion of the epoxide were significantly improved by the addition of 1 part of 1,2-benzisothiazol-3(2H)-one.

Example 21

Crystal Violet Lactone Vs. Magenta-20 Leuco Dye as the Co-catalyst

Example 21A

Crystal Violet Lactone as the Co-catalyst

An adhesive composition containing 13.19 parts of RSL 1462, 14.94 parts of RSL 1739, 22.80 parts of Epon 165, 12.40 parts of HyPox UA 11, 2.47 parts of Min-U-Sil5, 4.93 parts of Cab-O-Sil-M5, 12.37parts of PKHH, 0.3 parts of BYK322, 14 parts of HXA 3932 HP latent agent, 1 part of Co-catalyst C9, 0.5 parts of 1,2-benzisothiazol-3(2H)-one, and 1.1 parts of Crystal violet lactone was coated on a release substrate and dried at room temperature. The DSC thermogram of the resultant film showed a $T_{onset}$ at 88.98° C., a $T_{peak}$ at 117.54° C. and a ΔHp of 244 J/g. The sample was aged at 40° C. and 40% RH for 48 hours and the DSC thermogram of the aged sample showed a $T_{onset}$ at 94.29° C., a $T_{peak}$ at 129.72° C. and a ΔHp of 199 J/g. Significant decreases in both the curing rate and conversion were observed after the sample was subjected to the 40° C. and 40% RH aging test.

Example 21B

Magenta-20 Leuco Dye as the Co-catalyst

The same composition and procedure of Example 21A were employed except that the 1.1 parts of crystal violet lactone was replaced by 1.1 parts of Magenta-20 leuco dye. The DSC thermogram of the resultant film showed a $T_{onset}$ at 89.03° C., a $T_{peak}$ at 116.34° C. and a ΔHp of 243 J/g. The sample was aged at 40° C. and 40% RH for 48 hours and the DSC thermogram of the aged sample showed a $T_{onset}$ at 98.78° C., a $T_{peak}$ at 128.55° C. and a ΔHp of 237.5 J/g.

Comparing to crystal violet lactone, it is evident that the addition of 1.1 parts of Magenta-20 leuco dye improved not only the curing rate and conversion, but also the shelf life of the adhesive.

Example 22A 1,2-Benzisothiazol-3(2H)-one, Co-catalyst C9 and Crystal Violet Lactone as the Co-catalysts An adhesive composition containing 15.62 parts of RSL 1462, 17.69 parts of RSL 1739, 18.67 parts of Epon 165, 14.07 parts of HyPox UA 11, 4.90 parts of Min-U-Sil5, 1.5 parts of Cab-O-Sil-M5, 15 parts of PKHH, 0.3 parts of BYK322, and 14 parts of HXA 3932 HP latent agent was coated on a release substrate and dried at room temperature. The DSC thermogram of the resultant film showed a $T_{onset}$ at 97.6° C., a $T_{peak}$ at 118° C. and a ΔHp of 223 J/g.

Example 22B 1,2-Benzisothiazol-3(2H)-one, Co-catalyst C9 and Crystal Violet Lactone as the Co-catalysts The same composition and procedure of Example 22A were employed except that 0.5 parts of 1,2-benzisothiazol-3(2H)-one, 1 part of co-catalyst C9, and 1.1 parts of Crystal violet lactone were added into the formulation. The DSC thermogram of the resultant film showed a $T_{onset}$ at 86.97° C., a $T_{peak}$ at 116.42° C. and a ΔHp of 245 J/g. It is evident from Examples 18A, 18B, 19A, 19B, 20A, 20B, 22A and 22B that the addition of the three co-catalysts showed a synergistic effect in enhancing both curing rate and conversion.

Example 23

Co-catalyst C9 vs. Co-catalyst (C9-IPDI-C9)

Example 23A

Co-catalyst C9 as the Co-catalyst

An adhesive composition containing 15.42 parts of RSL 1462, 17.49 parts of RSL 1739, 18.47 parts of Epon 165, 13.87 parts of HyPox UA 11, 3 parts of Cab-O-Sil-M5, 4.4 parts of Min-U-Sil5, 10.45 parts of PKHH, 0.3 parts of BYK322, 14 parts of HXA 3932 HP latent agent, 1.1 parts of Magenta-20, 0.5 parts of 1,2-benzisothiazol-3(2H)-one, and 1 part of C9 was coated on a release substrate and dried at room temperature. The DSC thermogram of the resultant film showed a $T_{onset}$ at 95.12° C., a $T_{peak}$ at 115.89° C. and a ΔHp of 214 J/g. The sample was aged at 40° C. and 90% RH for 12 hours, and the DSC thermogram of the aged sample showed a $T_{onset}$ of 111.47° C., $T_{peak}$ of 129.32° C. and a ΔHp of 249 J/g. A significant decrease in curing rate was observed after aging.

Example 23B

Co-catalyst (C9-IPDI-C9) as the Co-catalyst

The same composition and procedure of Example 23A were employed except that the 1 part of co-catalyst C9 was replaced by 1 part of co-catalyst (C9-IPDI-C9) as prepared in Example 15. The DSC thermogram of the resultant film showed a $T_{onset}$ at 96.32° C., a $T_{peak}$ at 117.62° C. and a ΔHp of 202 J/g. The sample was aged at 40° C. and 90% RH for 12 hours, and the DSC thermogram of the aged sample showed a $T_{onset}$ at 106.56° C., a $T_{peak}$ at 127.83° C. and a ΔHp of 255 J/g. It is evident that the co-catalyst C9-IPDI-C9, a higher molecular weight, dimeric version of co-catalyst C9, resulted in an adhesive of a better environmental stability.

Example 24

Co-catalyst (C9-IPDI-C9) vs. Co-catalyst (C9-IPDI-PPG-IPDI-C9)

Example 24A

Co-catalyst (C9-IPDI-C9) as the Co-catalyst

An adhesive composition containing 13.30 parts of RSL 1462, 15.26 parts of RSL 1739, 20.72 parts of Epon 165, 15.28 parts of HyPox UA 11, 3 parts of Cab-O-Sil-M5, 4.4 parts of Min-U-Sil5, 11.76 parts of Butvar, 0.3 parts of BYK322, 16 parts of HXA 3932 HP latent agent, and 1 part of Co-catalyst (C9-IPDI-C9) was coated on a release substrate and dried at room temperature. The DSC thermogram of the resultant film showed a $T_{onset}$ at 93.03° C., a $T_{peak}$ at 116.86° C. and a ΔHp of 254 J/g. The sample was aged at 40° C. and 90% RH for 24 hours, and the DSC thermogram of the aged sample showed a $T_{onset}$ at 109.5° C., a speak at 126.85° C. and a ΔHp of 225 J/g.

Example 24B

Co-catalyst (C9-IPDI-PPG-IPDI-C9) as the Co-catalyst

The same composition and procedure of Example 24A were employed except that the 1 part of co-catalyst (C9-IPDI-C9) was replaced by 1 part of Co-catalyst (C9-IPDI-PPG-IPDI-C9) as prepared in Example 16. The DSC thermogram of the resultant film showed a $T_{onset}$ at 102.8° C., a $T_{peak}$ at 124.86° C. and a ΔHp at 143.8 J/g. The sample was aged at 40° C. and 90% RH for 24 hours, and the DSC thermogram of the aged sample showed a $T_{onset}$ at 118.23° C., a $T_{peak}$ at 133.78° C. and a ΔHp of 159.7 j/g. It is evident that the higher molecular weight Co-catalyst (C9-IPDI-PPG-IPDI-C9) improved the environmental stability although the curing rate before aging was slower than that of the sample containing C9-IPDI-C9 as the co-catalyst.

Example 25

Co-catalyst (C9-IPDI-C9) vs. Co-catalyst (C9-IPDI-PPG-IPDI-C9)

Example 25A

Co-catalyst (C9-IPDI-C9) as the Co-catalyst

An adhesive composition containing 13.30 parts of RSL 1462, 15.26 parts of RSL 1739, 20.72 parts of Epon 165, 15.28 parts of HyPox UA 11, 3 parts of Cab-O-Sil-M5, 4.4 parts of Min-U-Sil5, 11.76 parts of Butvar, 0.3 parts of BYK322, and 16 parts of HXA 3932 HP latent agent, 1.1 parts of Magenta-20, 0.5 parts of 1,2-benzisothiazol-3(2H)-one, and 1 part of Co-catalyst (C9-IPDI-C9) was coated on a release substrate and dried at room temperature. The DSC thermogram of the resultant film showed a $T_{onset}$ at 93.08° C., $T_{peak}$ at 115.05° C. and a ΔHp of 265.9 J/g. The sample was aged at 40° C. and 90% RH for 24 hours, and the DSC thermogram of the aged sample showed a $T_{onset}$ at 105.48° C., a $T_{peak}$ at 127.55° C. and a ΔHp of 232.8 J/g.

Example 25B

Co-catalyst (C9-IPDI-PPG-IPDI-C9) as the Co-catalyst

The same composition and procedure of Example 25A were employed except that the 1 part of Co-catalyst (C9-IPDI-C9) was replaced by 1 part of Co-catalyst (C9-IPDI-PPG-IPDI-C9) as prepared in Example 16. The DSC thermogram of the resultant film showed a $T_{onset}$ at 94.86° C., a $T_{peak}$ at 116.17° C. and a ΔHp of 245.2 J/g. The sample was aged at 40° C. and 90% RH for 24 hours, and the DSC thermogram of the aged sample showed a $T_{onset}$ at 104.00° C., a $T_{peak}$ at 125.05° C. and a ΔHp of 219.2 J/g. It is evident from Examples 24A, 24B, 25A and 25B that the Magenta-20 leuco dye significantly improved the curing characteristics of the adhesive film. Moreover, the adhesive containing the higher molecular weight Co-catalyst (C9-IPDI-PPG-IPDI-C9) showed a better environmental stability that the one containing the lower molecular weight Co-catalyst (C9-IPDI-C9).

Example 26

Co-catalyst (C9-IPDI-C9) vs. Co-catalyst (C9-IPDI-Terathane-IPDI-C9)

Example 26A

Co-catalyst (C9-IPDI-C9) as the Co-catalyst

An adhesive composition containing 13.30 parts of RSL 1462, 15.26 parts of RSL 1739, 20.72 parts of Epon 165, 15.28 parts of HyPox UA 11, 3 parts of Cab-O-Sil-M5, 4.4 parts of Min-U-Sil5, 11.76 parts of Butvar, 0.3 parts of BYK322, 16 parts of HXA 3932 HP latent agent, and 1 part of Co-catalyst (C9-IPDI-C9) was coated on a release substrate and dried at room temperature. The DSC thermogram of the resultant film showed a $T_{onset}$ at 93.03° C., a $T_{peak}$ at 116.86° C. and a ΔHp of 254 J/g. The sample was aged at 40° C. and 90% RH for 24 hours, and the DSC thermogram of the aged sample showed a $T_{onset}$ at 109.5° C., a $T_{peak}$ at 126.85° C. and a ΔHp of 225 J/g.

Example 26B

Co-catalyst (C9-IPDI-Terathane-IPDI-C9) as the Co-catalyst

The same composition and procedure of Example 26A were employed except that the 1 part of Co-catalyst (C9-IPDI-C9) was replaced by 1 part of Co-catalyst (C9-IPDI-Terathane-IPDI-C9) as prepared in Example 17. The DSC thermogram of the resultant film showed a $T_{onset}$ at 102.8° C., a $T_{peak}$ at 126.38° C. and a dHp of 142.7 J/g. The sample was aged at 40° C. and 90% RH for 24 hours, and the DSC thermogram of the aged sample showed a $T_{onset}$ at 118.15° C., a $T_{peak}$ at 133.7° C. and a ΔHp of 203.9 J/g. It is evident that the higher molecular weight Co-catalyst (C9-IPDI-Terathane-IPDI-C9) showed a better environmental stability than the lower molecular weight Co-catalyst (C9-IPDI-C9), although the curing rate of the former before aging is no better than the latter.

Example 27

Co-catalyst (C9-IPDI-C9) vs. Co-catalyst (C9-IPDI-Terathane-IPDI-C9)

Example 27A

Co-catalyst (C9-IPDI-C9), Magenta-20, and 1,2-benzisothiazol-3(2H)-one

An adhesive composition containing 13.30 parts of RSL 1462, 15.26 parts of RSL 1739, 20.72 parts of Epon 165, 15.28 parts of HyPox UA 11, 3 parts of Cab-O-Sil-M5, 4.4 parts of Min-U-Sil5, 11.76 parts of Butvar, 0.3 parts of BYK322, and 16 parts of HXA 3932 HP latent agent, 1.1 parts of Magenta-20, 0.5 parts of 1,2-benzisothiazol-3(2H)-one, and 1 part of Co-catalyst (C9-IPDI-C9) was coated on a release substrate and dried at room temperature. The DSC thermogram of the resultant film showed a $T_{onset}$ at 93.03° C., a $T_{peak}$ at 116.86° C. and a ΔHp of 254 J/g. The sample was aged at 40° C. and 90% RH for 24 hours, and the DSC thermogram of the aged sample showed a $T_{onset}$ at 109.5° C., a $T_{peak}$ at 126.85° C and a ΔHp of 225 J/g.

Example 27B

Co-catalyst (C9-IPDI-Terathane-IPDI-C9), Magenta-20, and 1,2-benzisothiazol-3(2H)-one The same composition and procedure of Example 27A were employed except that the 1 part of Co-catalyst (C9-IPDI-C9) was replaced by 1 part of Co-catalyst (C9-IPDI-Terathane-IPDI-C9). The DSC thermogram of the resultant film showed a $T_{onset}$ at 92.56° C., a $T_{peak}$ at 115.12° C. and a ΔHp of 247 J/g. The sample was aged at 40° C. and 90% RH for 24 hours, and the DSC thermogram of the aged sample showed a $T_{onset}$ at 106.96° C., a $T_{peak}$ at 128.31° C. and a ΔHp of 239 J/g. It is evident that a synergistic effect exists among Co-catalyst (C9-IPDI-Terathane-IPDI-C9), Magenta-20, and 1,2-benzisothiazol-3(2H) for improved curing rate and shelf-life.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A one part epoxy composition, comprising:
   an epoxy resin;
   a triarylmethane leuco dye having a functional group on at least one aromatic ring thereof, wherein the functional group is selected from the group consisting of N,N-dialkylamino, N,N-diarylamino, N-alkyl-N-arylamino, N-alkylamino, and N-arylamino;
   an imidazole-based catalyst, wherein the imidazole-based catalyst is microencapsulated or protected and activated by one of heat, pressure, radiation or a combination thereof; and
   a urea secondary co-catalyst or co-curing agent having a molecular weight of more than 300 and a functional group selected from the group consisting of N,N-dialkylamino, N,N-diarylamino, N-alkyl-N-arylamino, and dicycloalkylamino;

wherein the one part epoxy composition comprises from between about 0.05% to about 15% by weight of the triarylmethane leuco dye and between about 2% to about 40% by weight of the imidazole-based catalyst.

2. A one part epoxy composition, comprising:

an epoxy resin;

a triarylmethane leuco dye having a functional group on at least one aromatic ring thereof, wherein the functional group is selected from the group consisting of N,N-dialkylamino, N,N-diarylamino, N-alkyl-N-arylamino, N-alkylamino, and N-arylamino;

an imidazole-based catalyst, wherein the imidazole-based catalyst is microencapsulated or protected and activated by one of heat, pressure, radiation or a combination thereof; and a urea secondary co-catalyst or co-curing agent having a molecular weight of more than 500 and a functional group selected from the group consisting of N,N-dialkylamino, N,N-diarylamino, N-alkyl-N-arylamino, and dicycloalkylamino;

wherein the one part epoxy composition comprises from between about 0.05% to about 15% by weight of the triarylmethane leuco dye and between about 2% to about 40% by weight of the imidazole-based catalyst.

* * * * *